(12) United States Patent
Kawawake et al.

(10) Patent No.: US 6,245,450 B1
(45) Date of Patent: Jun. 12, 2001

(54) EXCHANGE COUPLING FILM MAGNETORESISTANCE EFFECT DEVICE MAGNETORESISTANCE EFFECTIVE HEAD AND METHOD FOR PRODUCING MAGNETORESISTANCE EFFECT DEVICE

(75) Inventors: Yasuhiro Kawawake, Uji; Hiroshi Sakakima, Kyotanabe; Mitsuo Satomi, Katano; Yasunari Sugita, Kadoma, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/236,711

(22) Filed: Jan. 25, 1999

Related U.S. Application Data

(63) Continuation-in-part of application No. 09/193,825, filed on Nov. 17, 1998, now abandoned.

(30) Foreign Application Priority Data

Nov. 17, 1997 (JP) .................................................. 9-314940
Dec. 22, 1997 (JP) .................................................. 9-352614
Jan. 16, 1998 (JP) .................................................. 10-006681

(51) Int. Cl.$^7$ ........................................................ G11B 5/66
(52) U.S. Cl. ............... 428/692; 428/694 T; 428/634 TS; 428/634 TM; 428/900; 324/252; 204/192.2
(58) Field of Search .............................. 428/692, 694 T, 428/634 TS, 634 TM, 900; 324/252; 204/192.2

(56) References Cited

U.S. PATENT DOCUMENTS

| | | | |
|---|---|---|---|
| 5,373,238 | 12/1994 | McGuire et al. | 324/252 |
| 5,465,185 | 11/1995 | Heim et al. | 360/324.11 |
| 5,583,725 | 12/1996 | Coffey et al. | 360/324.11 |
| 5,598,308 | 1/1997 | Dieny et al. | 360/324.1 |
| 5,627,703 | 5/1997 | Smith | 360/314 |
| 5,701,223 | 12/1997 | Fontana, Jr. et al. | 360/324.11 |
| 5,705,973 | 1/1998 | Yuan et al. | 338/32 R |
| 6,051,304 | * 4/2000 | Takahashi | 478/141 |

FOREIGN PATENT DOCUMENTS

| | | |
|---|---|---|
| 0 596 689 B1 | 11/1994 | (EP) . |
| 7-220246 | 8/1995 | (JP) . |
| 07262529 | 10/1995 | (JP) . |
| 7-509811 | 10/1995 | (JP) . |
| 7-509812 | 10/1995 | (JP) . |
| 08087722A | 2/1996 | (JP) . |
| 09148651A | 6/1997 | (JP) . |
| 09063021A | 7/1997 | (JP) . |
| 9-205234 | 8/1997 | (JP) . |
| 09275233 | 10/1997 | (JP) . |
| 10-098219 | 4/1998 | (JP) . |
| WO 94/15223 | 7/1994 | (WO) . |
| WO 94/15224 | 7/1994 | (WO) . |

OTHER PUBLICATIONS

European Search Report for Application No. 98121708.6–2111–; Dated Mar. 19, 1999.
A. Lisfi et al.; Journal of Magnetism and Magnetic Materials; vol. 157/158; May 1, 1996; pp. 258/259; "Microstructure and Magnetic Properties of Spinel and Hexagonal Ferrimagnetics Films Prepared by Pulsed Laser Deposition".

* cited by examiner

*Primary Examiner*—Leszek Kiliman
(74) *Attorney, Agent, or Firm*—Renner, Otto, Boisselle & Sklar, LLP

(57) ABSTRACT

An exchange coupling film of the present invention includes a substrate and a multilayer film. The multilayer film includes: a ferromagnetic layer and a magnetization rotation suppressing layer provided adjacent to the ferromagnetic layer for suppressing a magnetization rotation of the ferromagnetic layer; and the magnetization rotation suppressing layer includes an Fe—M—O layer (where M=Al, Ti, Co, Mn, Cr, Ni or V).

27 Claims, 12 Drawing Sheets

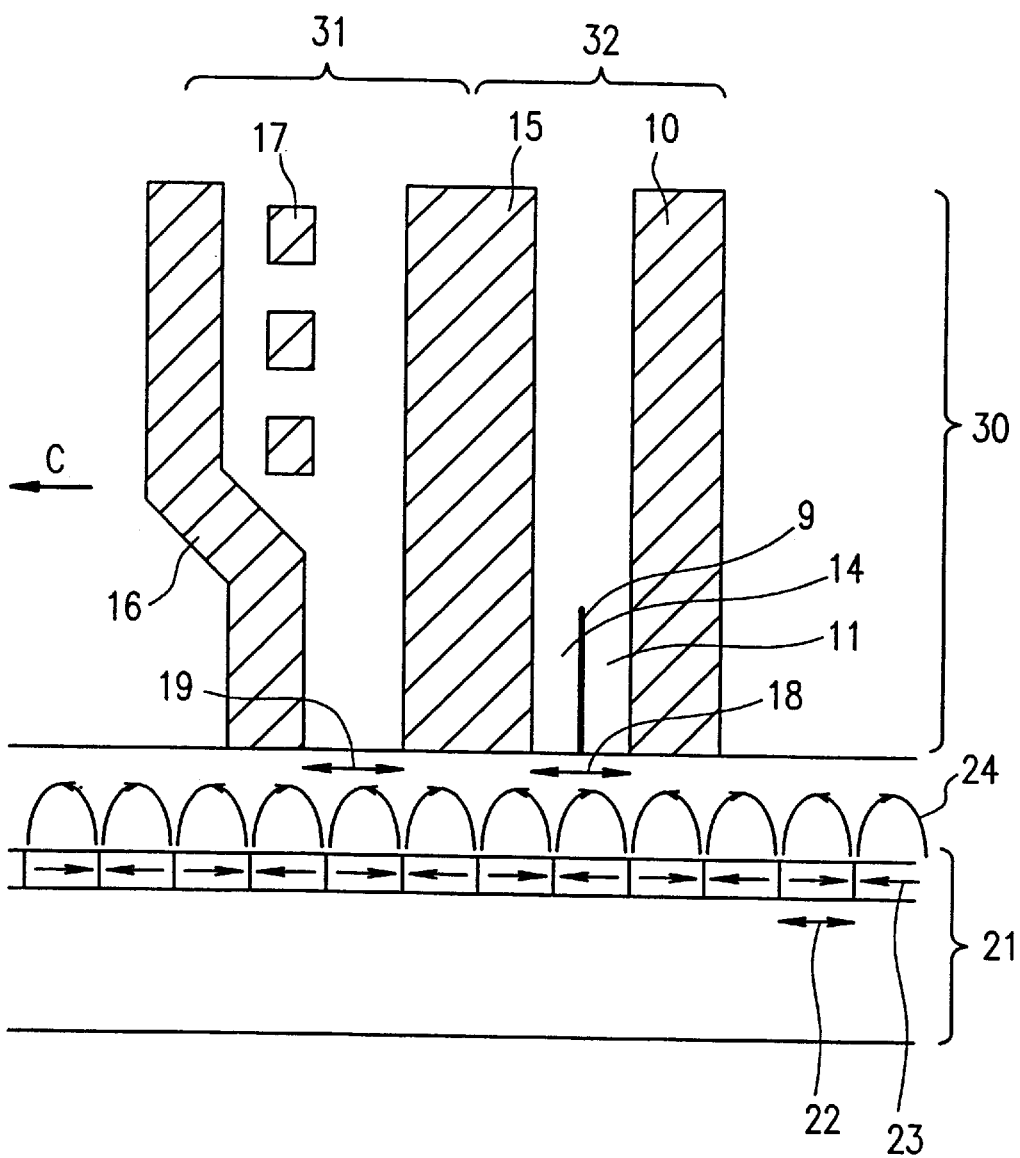

EXCHANGE COUPLING FILM MAGNETORESISTANCE EFFECT DEVICE MAGNETORESISTANCE EFFECTIVE HEAD AND METHOD FOR PRODUCING MAGNETORESISTANCE EFFECT DEVICE

This is a continuation in part of U.S. application Ser. No. 09,193,825 filed Nov. 17, 1998, now abandoned.

BACKGROUND OF THE INVENTION

1. Field of the Invention

The present invention relates to an exchange coupling film for fixing a magnetization direction of a ferromagnetic body, a magnetoresistance effect device incorporating the same which causes a substantial magnetoresistance change with a low magnetic field, a magnetoresistance head incorporating the same which is suitable for use in high density magnetic recording and reproduction, and a method for producing such a magneto-resistance effect device.

2. Description of the Related Art

In recent years, the density of a hard disk drive has been dramatically increased, while a reproduction magnetic head has also been improved dramatically. Among others, a magnetoresistance effect device (hereinafter, referred to simply as an "MR device") utilizing a giant magnetoresistance effect, which is also called a "spin valve", has been researched actively and is expected to have the potential to significantly improve the sensitivity of a currently-employed magnetoresistance effect head (hereinafter, referred to simply as an "MR head").

An MR device includes two ferromagnetic layers and a non-magnetic layer interposed between the ferromagnetic layers. The magnetization direction of one of the ferromagnetic layers (hereinafter, referred to also as a "fixed layer") is fixed by an exchange bias magnetic field from a magnetization rotation suppressing layer (the ferromagnetic layer and the magnetization rotation suppressing layer are referred to collectively as an "exchange coupling film"). The magnetization direction of the other one of the ferromagnetic layers (hereinafter, referred to also as a "free layer") is allowed to change relatively freely in response to an external magnetic field. In this way, the angle between the magnetization direction of the fixed layer and that of the free layer is allowed to change so as to vary the electric resistance of the MR device.

An MR device has been proposed which utilizes NiFe for the ferromagnetic layer, Cu for the non-magnetic layer and Fe—Mn for the magnetization rotation suppressing layer. The MR device provides a magnetoresistance rate of change (hereinafter, referred to simply as an "MR ratio") of about 2% (Journal of Magnetism and Magnetic Materials 93, p. 101, (1991)). When Fe—Mn is used for the magnetization rotation suppressing layer, the resulting MR ratio is small, and the blocking temperature (a temperature at which the magnetization rotation suppressing layer provides no effect of fixing the magnetization direction of the fixed layer) is not sufficiently high. Moreover, the Fe—Mn film itself has a poor corrosion resistance. In view of this, other MR devices have been proposed which employ magnetization rotation suppressing layers with materials other than Fe—Mn.

Among others, an MR device which employs an oxide, such as NiO or $\alpha$-$Fe_2O_3$, for the magnetization rotation suppressing layer is expected to realize a dramatically large MR ratio of about 15% or greater.

However, the blocking temperature of NiO is not sufficiently high. Therefore, the thermal stability of the MR device employing NiO is undesirable.

When an MR device employs a magnetization rotation suppressing layer of $\alpha$-$Fe_2O_3$, on the other hand, the reverse magnetic field of the fixed layer is not sufficiently large when the magnetization rotation suppressing layer is thin. Particularly, an MR device having a dual spin valve structure or an MR device where an $\alpha$-$Fe_2O_3$ layer is formed on the fixed layer has a strong tendency that the reverse magnetic field of the fixed layer obtained in the overlying $\alpha$-$Fe_2O_3$ layer is insufficient. Moreover, the thermal stability of the $\alpha$-$Fe_2O_3$-employing MR device is also undesirable for the same reasons as the NiO-employing MR device. Furthermore, the $\alpha$-$Fe_2O_3$-employing MR device has other problems in controlling the anisotropy during deposition in a magnetic field or during a heat treatment in a magnetic field.

SUMMARY OF THE INVENTION

According to one aspect of this invention, an exchange coupling film includes a substrate and a multilayer film. The multilayer film includes: a ferromagnetic layer and a magnetization rotation suppressing layer provided adjacent to the ferromagnetic layer for suppressing a magnetization rotation of the ferromagnetic layer; and the magnetization rotation suppressing layer includes an Fe—M—O layer (where M=Al, Ti, Co, Mn, Cr, Ni or V).

In one embodiment of the invention, the magnetization rotation suppressing layer includes an $(Fe_{1-x}M_x)_2O_3$ layer (where M=Al, Ti, Co, Mn, Cr, Ni or V, and $0.01 \leq x \leq 0.4$).

In one embodiment of the invention, the magnetization rotation suppressing layer further includes an NiO layer.

In one embodiment of the invention, the magnetization rotation suppressing layer further includes an Fe—M'—O layer (where M'=Al, Ti, Co, Mn, Cr, Ni or V). The Fe—M'—O layer has a composition different from that of the Fe—M—O layer.

In one embodiment of the invention, a surface roughness of the multilayer film is about 0.5 nm or less.

In one embodiment of the invention, a thickness of the magnetization rotation suppressing layer is in a range between about 5 nm and about 100 nm.

In one embodiment of the invention, the thickness of the magnetization rotation suppressing layer is in a range between about 5 nm and about 50 nm.

In one embodiment of the invention, after the magnetization rotation suppressing layer and the ferromagnetic layer are formed, the exchange coupling film is subjected to a heat treatment in a magnetic field at a temperature of about 150° C. to about 350° C.

According to another aspect of this invention, a magnetoresistance effect device includes a substrate and a multilayer film. The multilayer film includes at least two ferromagnetic layers, a non-magnetic layer, and a magnetization rotation suppressing layer for suppressing a magnetization rotation of one of the ferromagnetic layers. The ferromagnetic layers are provided via the non-magnetic layer interposed therebetween. At least one of the ferromagnetic layers is a fixed layer whose magnetization direction is fixed by the magnetization rotation suppressing layer which is provided in contact with the one of the ferromagnetic layers on an opposite side of another one of the ferromagnetic layers with respect to the non-magnetic layer. At least one of the ferromagnetic layers is a free layer whose magnetization direction is allowed to rotate freely. A change in an angle between the magnetization direction of the fixed layer and the magnetization direction of the free layer causes an electric resistance of the device to vary. The magnetization rotation suppressing layer includes an Fe—M—O layer (where M=Al, Ti, Co, Mn, Cr, Ni or V).

In one embodiment of the invention, the magnetization rotation suppressing layer includes an $(Fe_{1-x}M_x)_2O_3$ layer (where M=Al, Ti, Co, Mn, Cr, Ni or V, and $0.01 \leq x \leq 0.4$).

In one embodiment of the invention, the magnetization rotation suppressing layer further includes an NiO layer.

In one embodiment of the invention, the magnetization rotation suppressing layer further includes an Fe—M'—O layer (where M'=Al, Ti, Co, Mn, Cr, Ni or V). The Fe—M'—O layer has a composition different from that of the Fe—M—O layer.

In one embodiment of the invention, a surface roughness of the multilayer film is about 0.5 nm or less.

In one embodiment of the invention, a thickness of the magnetization rotation suppressing layer is in a range between about 5 nm and about 100 nm.

In one embodiment of the invention, the thickness of the magnetization rotation suppressing layer is in a range between about 5 nm and about 50 nm.

In one embodiment of the invention, after the magnetization rotation suppressing layer and the fixed layer are formed, the magnetoresistance effect device is subjected to a heat treatment in a magnetic field at a temperature of about 150° C. to about 350° C.

In one embodiment of the invention, the multilayer includes a first magnetization rotation suppressing layer, a first fixed layer, a first non-magnetic layer, a ferromagnetic free layer, a second non-magnetic layer, a second fixed layer and a second magnetization rotation suppressing layer which are deposited in this order on the substrate. The first magnetization rotation suppressing layer includes an Fe—M—O layer (where M=Al, Ti, Co, Mn, Cr, Ni or V). The first magnetization rotation suppressing layer fixes a magnetization direction of the first fixed layer. The second magnetization rotation suppressing layer fixes a magnetization direction of the second fixed layer.

In one embodiment of the invention, the first magnetization rotation suppressing layer includes an $(Fe_{1-x}M_x)_2O_3$ layer (where M=Al, Ti, Co, Mn, Cr, Ni or V, and $0.01 \leq x \leq 0.4$).

In one embodiment of the invention, the second magnetization rotation suppressing layer includes an NiO layer or an Fe—M—O layer (where M=Al, Ti, Co, Mn, Cr, Ni or V).

In one embodiment of the invention, the free layer includes a third non-magnetic layer and two or more magnetic layers provided with the third non-magnetic layer interposed therebetween.

In one embodiment of the invention, the free layer includes a third non-magnetic layer and two or more magnetic layers provided with the third non-magnetic layer interposed therebetween.

In one embodiment of the invention, the fixed layer includes a third non-magnetic layer and two magnetic layers having an antiferromagnetic exchange coupling therebetween with the third non-magnetic layer interposed therebetween.

In one embodiment of the invention, at least one of the fixed layers includes a third non-magnetic layer and two magnetic layers having an antiferromagnetic exchange coupling therebetween with the third non-magnetic layer interposed therebetween.

According to still another aspect of this invention, a magnetoresistance effect head includes: a magnetoresistance effect device; and a shield gap section for insulating the magnetoresistance effect device from a shield section. The magnetoresistance effect device includes a substrate and a multilayer film. The multilayer film includes at least two ferromagnetic layers, a non-magnetic layer, and a magnetization rotation suppressing layer for suppressing a magnetization rotation of one of the ferromagnetic layers. The ferromagnetic layers are provided via the non-magnetic layer interposed therebetween. At least one of the ferromagnetic layers is a fixed layer whose magnetization direction is fixed by the magnetization rotation suppressing layer which is provided in contact with the one of the ferromagnetic layers on an opposite side of another one of the ferromagnetic layers with respect to the non-magnetic layer. At least one of the ferromagnetic layers is a free layer whose magnetization direction is allowed to rotate freely. A change in an angle between the magnetization direction of the fixed layer and the magnetization direction of the free layer causes an electric resistance of the device to vary. The magnetization rotation suppressing layer includes an Fe—M—O layer (where M=Al, Ti, Co, Mn, Cr, Ni or V).

According to still another aspect of this invention, a magnetoresistance effect head includes: the above-described magnetoresistance effect device; and a yoke section for introducing into the magnetoresistance effect device a magnetic field to be detected.

According to still another aspect of this invention, a method for producing a magnetoresistance effect device is provided. The device includes a substrate and a multilayer film. The multilayer film includes at least two ferromagnetic layers, a non-magnetic layer, and a magnetization rotation suppressing layer for suppressing a magnetization rotation of the one of ferromagnetic layers. The ferromagnetic layers are provided with the non-magnetic layer interposed therebetween. At least one of the ferromagnetic layers is a fixed layer whose magnetization direction is fixed by the magnetization rotation suppressing layer which is provided in contact with the one of the ferromagnetic layers on an opposite side of another one of the ferromagnetic layers with respect to the non-magnetic layer. At least one of the ferromagnetic layers is a free layer whose magnetization direction is allowed to rotate freely. A change in an angle between the magnetization direction of the fixed layer and the magnetization direction of the free layer causes an electric resistance of the device to vary. The method includes: a first step of forming the magnetization rotation suppressing layer on the substrate; and a second step of depositing the fixed layer, the non-magnetic layer and the free layer in this order on the magnetization rotation suppressing layer. The first step includes a step of sputtering a target whose main component is Fe—M—O (where M=Al, Ti, Co, Mn, Cr, Ni or V).

According to still another aspect of this invention, a method for producing a magnetoresistance effect device is provided. The device includes a substrate and a multilayer film. The multilayer film includes a first magnetization rotation suppressing layer, a first fixed layer, a first non-magnetic layer, a ferromagnetic free layer, a second non-magnetic layer, a second fixed layer and a second magnetization rotation suppressing layer which are deposited in this order on the substrate. The first magnetization rotation suppressing layer fixes a magnetization direction of the first fixed layer. The second magnetization rotation suppressing layer fixes a magnetization direction of the second fixed layer. A change in an angle between the magnetization directions of the first and second fixed layers and the magnetization direction of the free layer causes an electric resistance of the device to vary. The method includes: a first step of forming the first magnetization rotation suppressing layer on the substrate; a second step of depositing the first fixed layer, the first non-magnetic layer, the free layer, the second non-magnetic layer and the second fixed layer in this order on the first magnetization rotation suppressing layer; and a third step of forming the second magnetization rotation suppressing layer on the second fixed layer. The first and third steps each includes a step of sputtering a target whose main component is Fe—M—O (where M=Al, Ti, Co, Mn, Cr, Ni or V).

Thus, the invention described herein makes possible the advantages of: (1) providing an exchange coupling film having a good thermal stability and a large MR ratio; (2) providing an MR device incorporating such an exchange coupling film; (3) providing an MR head incorporating such an MR device; and (4) providing a method for producing such an MR device.

These and other advantages of the present invention will become apparent to those skilled in the art upon reading and understanding the following detailed description with reference to the accompanying figures.

BRIEF DESCRIPTION OF THE DRAWINGS

FIG. 6 is a cross-sectional view illustrating the MR head of the present invention along with a magnetic disk;

DESCRIPTION OF THE PREFERRED EMBODIMENTS

An exchange coupling film, an MR device and an MR head of the present invention will now be described with reference to the accompanying figures.

Figure 1:
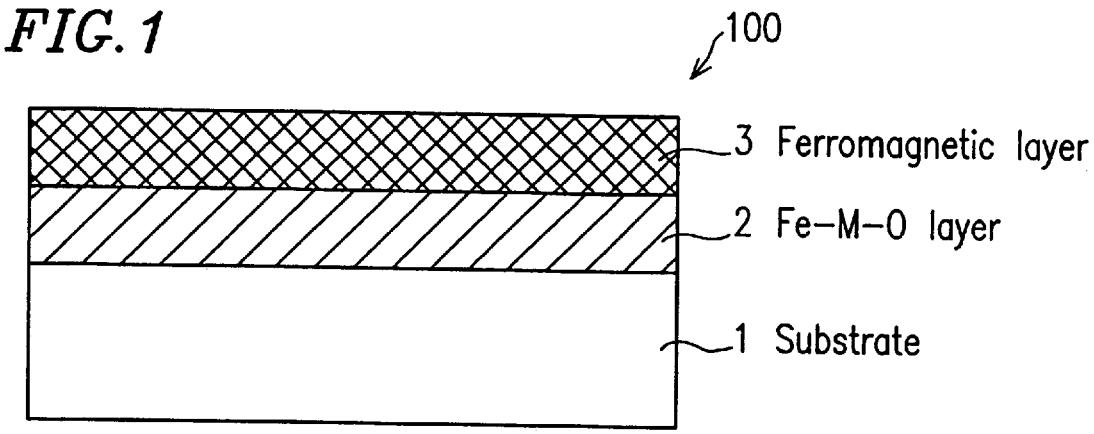
FIG. 1 is a cross-sectional diagram illustrating an exchange coupling film of the present invention.

FIG. 1 illustrates an exchange coupling film 100 of the present invention. Referring to FIG. 1, an Fe—M—O layer 2 and a ferromagnetic layer 3 are deposited in this order on a substrate 1. A feature of the present invention is the use of the Fe—M—O layer 2 as a magnetization rotation suppressing layer for applying an exchange bias magnetic field to the ferromagnetic layer 3.

The "Fe—M—O layer" as used herein is a layer obtained by adding, to an Fe—O magnetization rotation suppressing layer, a third element M, wherein the atomic composition ratio between the metal (Fe+M) and oxygen (O) is about 1/1.2 to about 1/1.6.

When the third element M is added to the Fe—O magnetization rotation suppressing layer such that the atomic composition ratio between the Fe+M and O is about 1/1.2 to about 1/1.6, as described above, the pinning effect, that is, the fixing of the magnetization direction of the fixed layer can be improved even by a heat treatment at a relatively low temperature. Preferably, the atomic composition ratio is in a range between about 1/1.35 to about 1/1.55.

An atomic composition ratio between Fe+M and O outside the range of about 1/1.2 to about 1/1.6 is not preferred. The atomic composition ratio less than about 1/1.2 results in a poor pinning effect. When the atomic composition ratio is greater than about 1/1.6, the Fe—M—O layer 2 becomes a weak ferromagnetic body unsuitable for use in an MR head.

Next, an MR device incorporating the exchange coupling film 100 will be described in detail.

Figure 2:
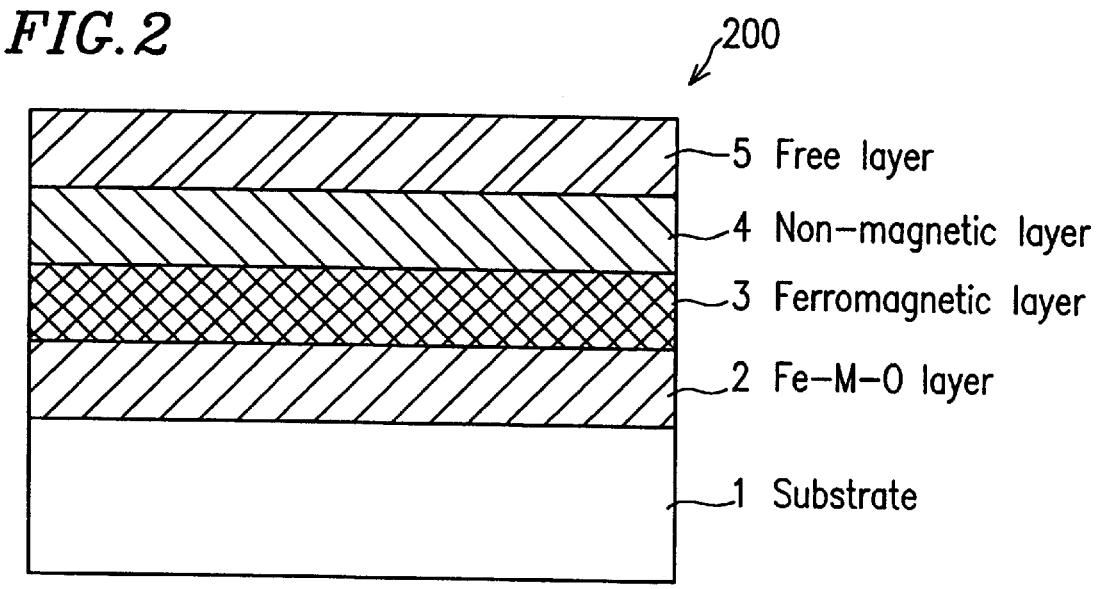
FIG. 2 is a cross-sectional diagram illustrating an MR device of the present invention.

FIG. 2 is a cross-sectional view illustrating an exemplary MR device 200 of the present invention. Referring to FIG. 2, an Fe—M—O layer 2, a ferromagnetic fixed layer 3, a non-magnetic layer 4 and a ferromagnetic free layer 5 are deposited in this order on the substrate 1. The magnetization direction of one of the ferromagnetic layers (the fixed layer 3) is "pinned" or fixed by the exchange bias magnetic field from the Fe—M—O layer 2. The other ferromagnetic layer (the free layer 5) is magnetically separated from the free layer 3 via the non-magnetic layer 4, so that the magnetization direction of the free layer 5 is allowed to change relatively freely in response to an external magnetic field from outside the MR device 200.

In this way, the angle between the magnetization direction of the fixed layer 3 and that of the free layer 5 is allowed to change so as to vary the electric resistance of the MR device 200. When the MR device 200 is used as an MR sensor, the change in the electric resistance of the MR device 200 in response to an external magnetic field can be detected as an electric signal.

As described above, a feature of the present invention is the use of the Fe—M—O layer 2 as the magnetization rotation suppressing layer. As described in the description of the related art, an MR device employing $\alpha$-$Fe_2O_3$ exhibits a large MR ratio, but provides an insufficient magnetic field for pinning the fixed layer 3 (particularly in a dual structure or in the $\alpha$-$Fe_2O_3$ layer formed under the fixed layer). Moreover, the characteristics of such an MR device is unlikely to be improved by a low-temperature heat treatment in a magnetic field.

In order to solve this problem, the present invention employs an Fe oxide (Fe—O) layer as the magnetization rotation suppressing layer 2 in which the Fe atoms are partially substituted by another element such as Al, Ti, Co, Mn, Cr, Ni or V.

The atomic composition ratio between the metal (Fe+M) and oxygen (O) is preferably about 1/1.2 to about 1/1.6. When the Fe atoms are partially substituted by an element such as Al, Ti, Mn or V, there is provided a greater pinning effect, that is, the fixing of the magnetization direction of the fixed layer 3 after a heat treatment at a temperature of about 150° C. to about 350° C. When the Fe atoms are partially substituted by an element such as Co or Ni, there is provided an MR device having a greater pinning magnetic field after production of the MR device or after a heat treatment.

Among others, Mn and Co are particularly effective in obtaining a large MR ratio. For a greater pinning magnetic field, Co is particularly effective. A desirable composition of the Fe—M—O layer for obtaining a larger pinning magnetic field is:

$(Fe_{1-x}M_x)_2O_3$ (where M=Al, Ti, Co, Mn, Cr, Ni or V, and $0.01 \leq x \leq 0.4$).

When x is excessively small, the resulting effect is insufficient. When x is excessively large, the resulting pinning effect may be reduced. When Fe is substituted by an element other than the above-listed elements (Al, Ti, Co, Mn, Cr, Ni and V), a problem may arise where the Fe—M—O layer becomes ferromagnetic, thereby causing spontaneous magnetization of the Fe—M—O layer.

When the thickness of the Fe—M—O layer 2 is excessively small, the effect of pinning the magnetization direction of the fixed layer 3 may be insufficient. The thickness of the Fe—M—O layer 2 should be at least about 5 nm. When the thickness of the Fe—M—O layer 2 is excessively large, the surface roughness thereof is increased, so that a magnetic coupling is more likely to occur between the free layer 5 and the fixed layer 3. Therefore, the thickness of the Fe—M—O layer 2 is preferably about 100 nm or less, and more preferably about 50 nm. This is a particularly important condition for an MR device having a dual structure.

While a magnetization rotation suppressing layer is usually an antiferromagnetic body, the entire magnetization rotation suppressing layer 2 does not have to be completely antiferromagnetic so long as it is capable of performing the main role of the Fe—M—O layer 2 (i.e., fixing the magnetization direction of the fixed layer 3). For example, a portion of the magnetization rotation suppressing layer 2 can be a weak ferromagnetic body, a paramagnetic body or a ferromagnetic body so long as there is provided an effect of fixing the magnetization direction of the fixed layer 3.

Usually, an Ni—Co—Fe alloy layer is suitably used as the free layer 5 of the MR head. Preferably, the atomic composition ratio of the $Ni_xCo_yFe_z$ layer may be:

$0.6 \leq x \leq 0.9$ $0 \leq y \leq 0.4$ $0 \leq z \leq 0.3$ (thereby obtaining an Ni-rich soft magnetic film); or $0 \leq x \leq 0.4$ $0.2 \leq y \leq 0.95$ $0 \leq z \leq 0.5$ (thereby obtaining a Co-rich film). A film having such a composition exhibits a low magnetostriction ($1 \times 10^{-5}$) which is required for an MR sensor or an MR head.

An amorphous layer, such as a Co—Mn—B layer, a Co—Fe—B layer, a Co—Nb—Zr layer, or a Co—Nb—B layer, or a layered film of such an amorphous layer and the Ni—Co—Fe layer, may alternatively be used as the free layer 5.

Preferably, the thickness of the free layer 5 is in a range between about 1 nm and about 10 nm. When the free layer 5 is excessively thick, the MR ratio is reduced due to a shunting effect. When the free layer 5 is excessively thin, the soft magnetic property is reduced. More preferably, the thickness of the free layer 5 is in a range between about 2 nm and about 7 nm.

Preferred materials for the fixed layer 3 include Co, a Co—Fe alloy or an Ni—Fe—Co alloy. A particularly large MR ratio can be obtained when Co or a Co—Fe alloy is used. To obtain a large exchange coupling, an Ni—Fe-type material, an Ni—Fe—Co type material, or the like, may be used preferably. Therefore, it is desirable to employ an Ni-type material at the interface between the fixed layer 3 and the Fe—M—O layer 2 and a Co-type material at the interface between the fixed layer 3 and the non-magnetic layer 4, which is made of Cu, or the like.

Preferably, the thickness of the fixed layer 3 is in a range between about 1 nm and about 10 nm. The MR ratio is reduced when the fixed layer 3 is either excessively thin or excessively thick. More preferably, the thickness of the fixed layer 3 is in a range between about 1 nm and about 5 nm.

The fixed layer 3 may be in a multilayer structure including two magnetic layers which have an antiferromagnetic exchange coupling therebetween via the non-magnetic layer 4. More particularly, the fixed layer 3 may be a Co/Ru/Co multilayer film, for example. In such a case, the thickness of Ru needs to be such that there is provided an antiferromagnetic exchange coupling between the two Co films (e.g., about 0.6 nm in this instance). In the case of a normal MR device, when the MR device is extremely small, a problem arises where a magnetic pole occurring at the end surface of the fixed layer 3 applies an undesirable bias magnetic field to the free layer 5. When the fixed layer 3 is formed of two magnetic layers which have an antiferromagnetic exchange coupling, no bias magnetic field is applied to the free layer 5, thereby solving this problem.

While the non-magnetic layer 4 between the free layer 5 and the fixed layer 3 may be made of Cu, Ag, Au, Ru, or the like, Cu is particularly preferred. The thickness of the non-magnetic layer 4 needs to be at least about 0.9 nm in order to reduce the interaction between the two ferromagnetic layers (the fixed layer 3 and the free layer 5). When the non-magnetic layer 4 is excessively thick, the MR ratio is reduced. Therefore, the thickness of the non-magnetic layer 4 should be 10 nm or less, and more preferably about 3 nm or less.

It is also effective to insert an interface magnetic layer at the interface between one of the ferromagnetic layers (the fixed layer 3 or the free layer 5) and the non-magnetic layer 4 in order to further increase the MR ratio of the MR device. When the interface magnetic layer is excessively thick, the sensitivity of the MR ratio to the magnetic field is reduced. Therefore, the thickness of the interface magnetic layer is preferably about 2 nm or less, and more preferably about 1.8 nm or less. In order for the interface magnetic film to effectively function, the thickness thereof should be at least about 0.2 nm, and more preferably about 0.8 nm or greater. Preferably, Co or a Co-rich Co—Fe alloy is used as the material of the interface magnetic film.

Preferably, the substrate 1 has a relatively smooth surface, and may be a glass substrate, an MgO substrate, a Si substrate or an $Al_2O_3$-TiC substrate. An $Al_2O_3$-TiC substrate is particularly suitable for producing an MR head.

Another way to further increase the MR ratio of the MR device is to form a metal reflective layer on the free layer 5. Preferably, Ag, Au, or the like, is used as the material of the metal reflective layer.

When the metal reflective layer is excessively thick, the MR ratio is reduced due to a shunting effect. Therefore, the thickness of the metal reflective layer is preferably about 10 nm or less, and more preferably about 3 nm or less. When the metal reflective layer is excessively thin, the resulting effect will not be sufficient. Therefore, the thickness of the metal reflective layer is at least about 0.5 nm or greater, and more preferably about 1 nm or greater.

In the example described above in connection with FIG. 2, the Fe—M—O layer 2, the fixed layer 3, the non-magnetic layer 4 and the free layer 5 are deposited in this order on the substrate 1. These layers may alternatively be deposited in the opposite order (the free layer 5/the non-magnetic layer 4/the fixed layer 3/the Fe—M—O layer 2) on the substrate 1 directly or via an underlying layer. This reverse structure results in a slightly reduced pinning effect from that obtained by the structure illustrated in FIG. 2, but can still be used as an MR device and may be effective for some particular device designs.

Figure 3:
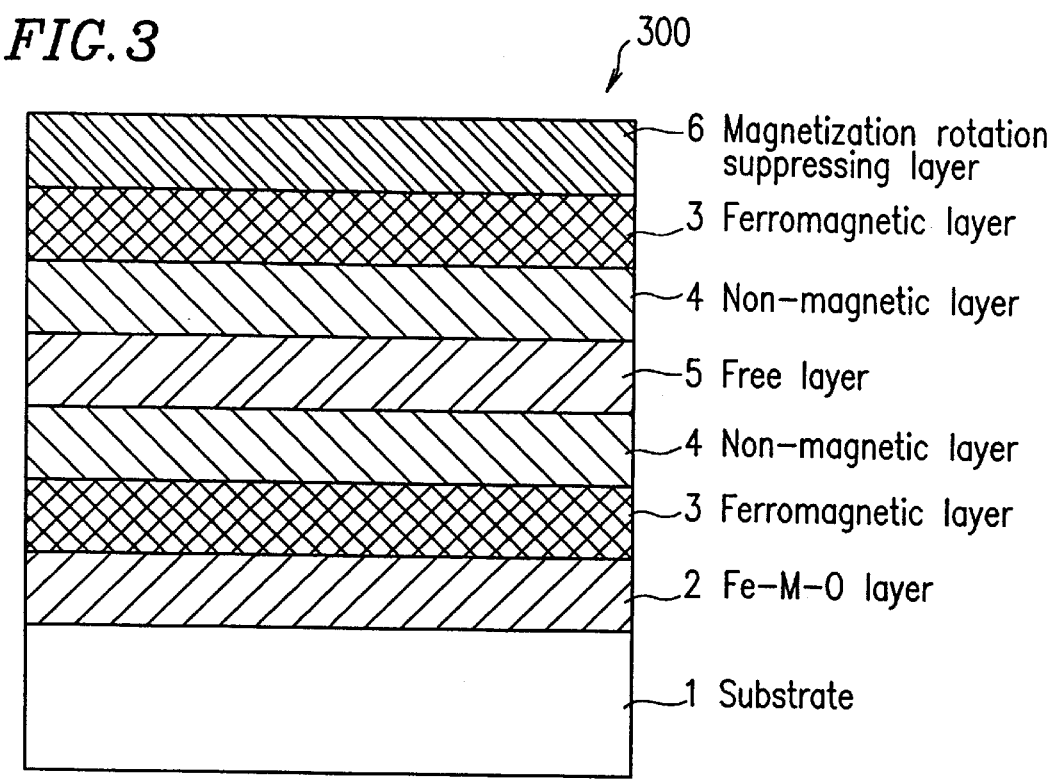
FIG. 3 is a cross-sectional diagram illustrating another MR device of the present invention.

While a normal MR device has been described above, an MR device 300 having a dual spin valve structure, as illustrated in FIG. 3, is also effective particularly for further increasing the MR ratio. In such a case, an Fe—M—O layer, an NiO layer, or a compound (layered) layer thereof, can be used for an uppermost magnetization rotation suppressing layer 6. An Fe—M—O layer is particularly preferred for the uppermost magnetization rotation suppressing layer 6 in order to further increase the MR ratio. In view of an MR device electrode formation or MR head formation, it is appropriate to use a metal antiferromagnetic material such as Fe—Mn, Ni—Mn, Pd—Mn, Pt—Mn, Ir—Mn or Fe—Ir. Among others, Pt—Mn is believed to be the best material in view of the thermal stability. Preferably, the atomic composition ratio of an $Pt_zMn_{1-z}$ layer may be:

$0.4 \leq z \leq 0.6$.

In the example illustrated in FIG. 3, the Fe—M—O layer 2 is deposited first on the substrate 1. Alternatively, the layers may be deposited on the substrate 1 in the reverse order from the magnetization rotation suppressing layer 6 to the Fe—M—O layer 2.

When NiO and $\alpha\text{-Fe}_2O_3$ are used in the above structure, it is preferable in view of the thermal stability and the film flatness to form an NiO layer first on the substrate 1, and then an $\alpha\text{-Fe}_2O_3$ layer on the NiO layer, so that the fixed layer 3 is pinned by $\alpha\text{-Fe}_2O_3$. In such a case, the thickness of the NiO film can be about 10 nm, while the $\alpha\text{-Fe}_2O_3$ layer is preferably thicker than the NiO film.

The layers can be formed suitably by a sputtering method. Sputtering methods which can be used to produce the MR device of the present invention include a DC sputtering method, an RF sputtering method, an ion beam sputtering method, and the like.

Figure 4:
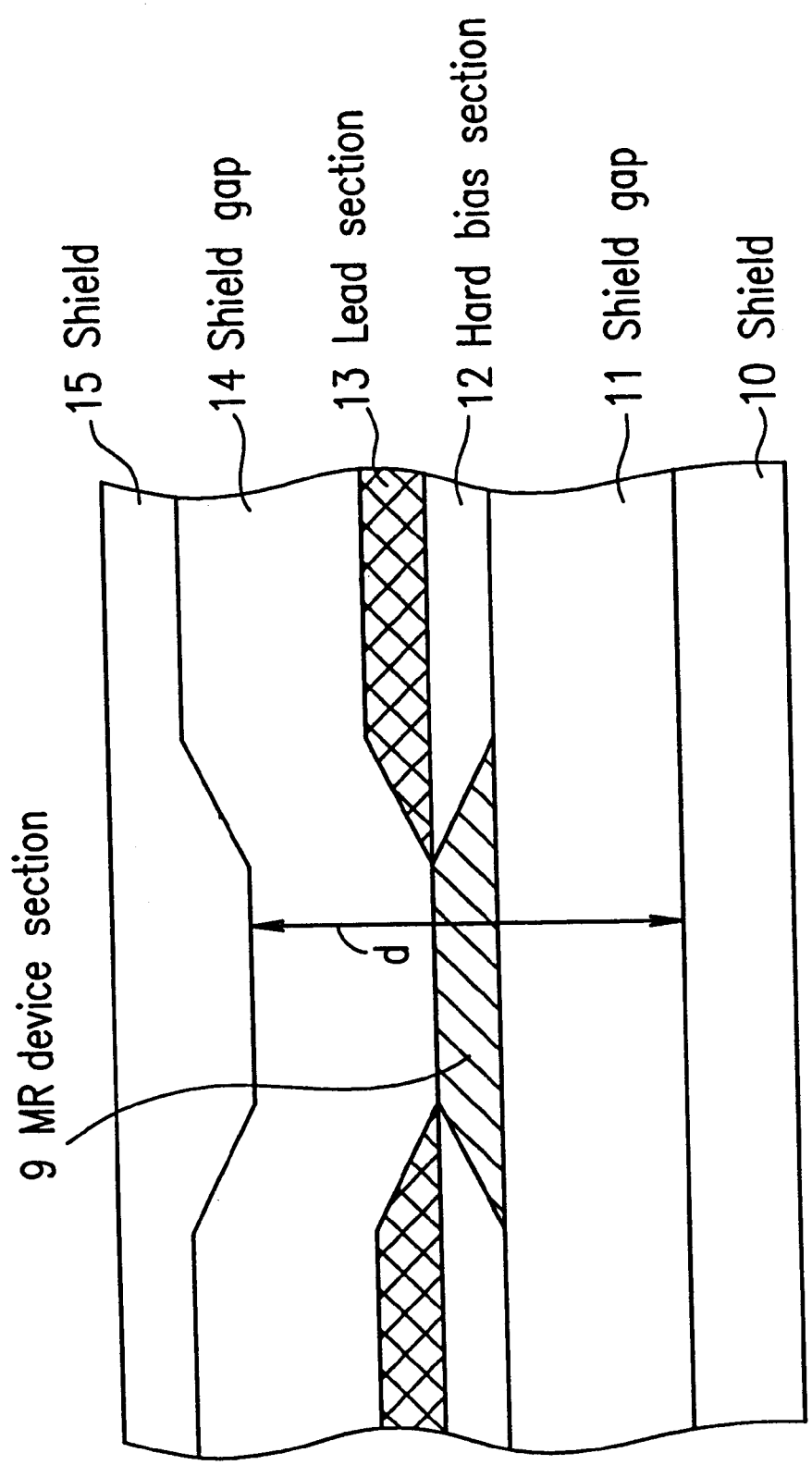
FIG. 4 is a cross-sectional diagram illustrating an MR head of the present invention.
Figure 5:
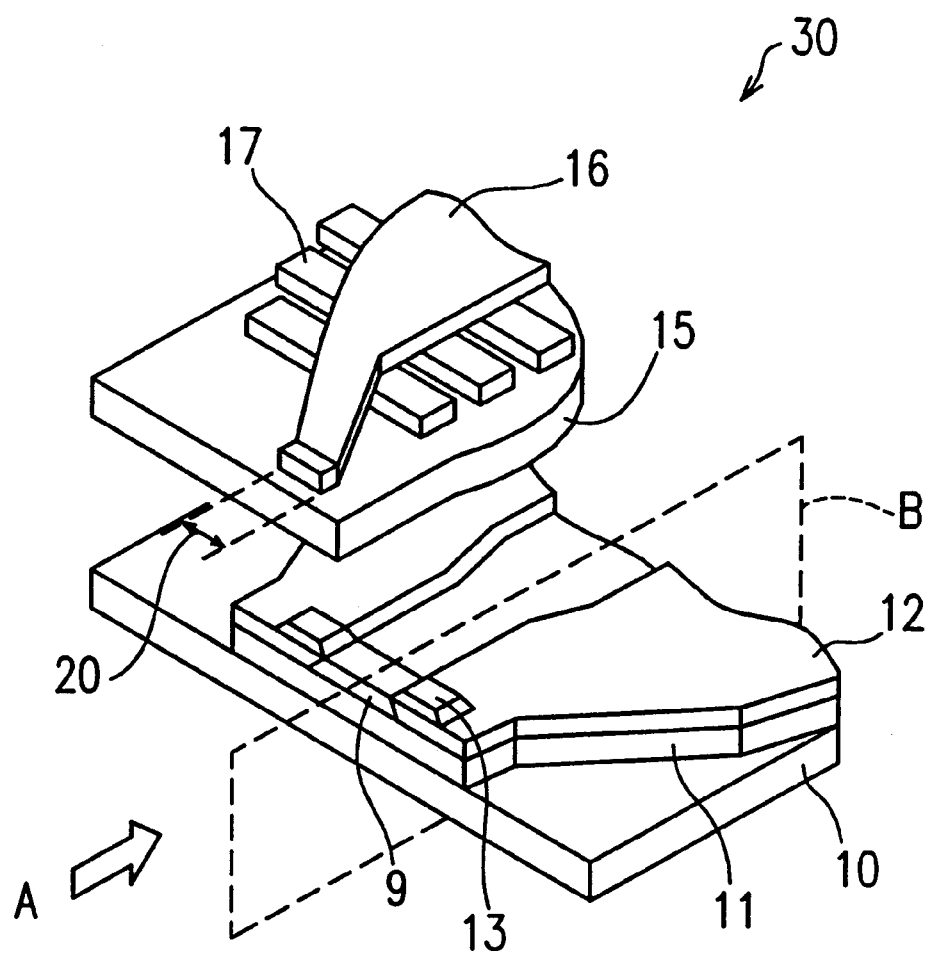
FIG. 5 is a perspective view illustrating the MR head of the present invention.

An MR head can be produced using the above-described MR device of the present invention. FIG. 5 is a perspective view which illustrates a structure of an exemplary MR head 30 of the present invention. FIG. 4 illustrates a cross-sectional view of FIG. 5 as viewed from the direction indicated by an arrow A in FIG. 5. FIG. 6 illustrates a cross-sectional view of FIG. 5 taken along a plane indicated by a broken line B in FIG. 5. FIG. 4 will be mainly referred to in the following description.

Referring to FIG. 4, an MR device section 9 is interposed between upper and lower shield gaps 14 and 11. An insulation film such as an $Al_2O_3$ film, an $SiO_2$ film, or the like, may be used as the shield gaps 11 and 14. Upper and lower shields 15 and 10 are further provided on the shield gaps 14 and 11, respectively. A soft magnetic film such as an Ni—Fe alloy film may be used as the shield material. In order to control the magnetic domain of the MR device, a bias magnetic field is applied by a hard bias section 12 made of a material such as a Co—Pt alloy. While a hard film is used in this instance for applying a bias magnetic field, an antiferromagnetic film such as an Fe—Mn film can similarly be used. The MR device section 9 is insulated from the shields 10 and 15 by the shield gaps 11 and 14, and changes in the resistance of the MR device section 9 can be read by applying an electric current thereto through a lead section 13.

Figure 7A:
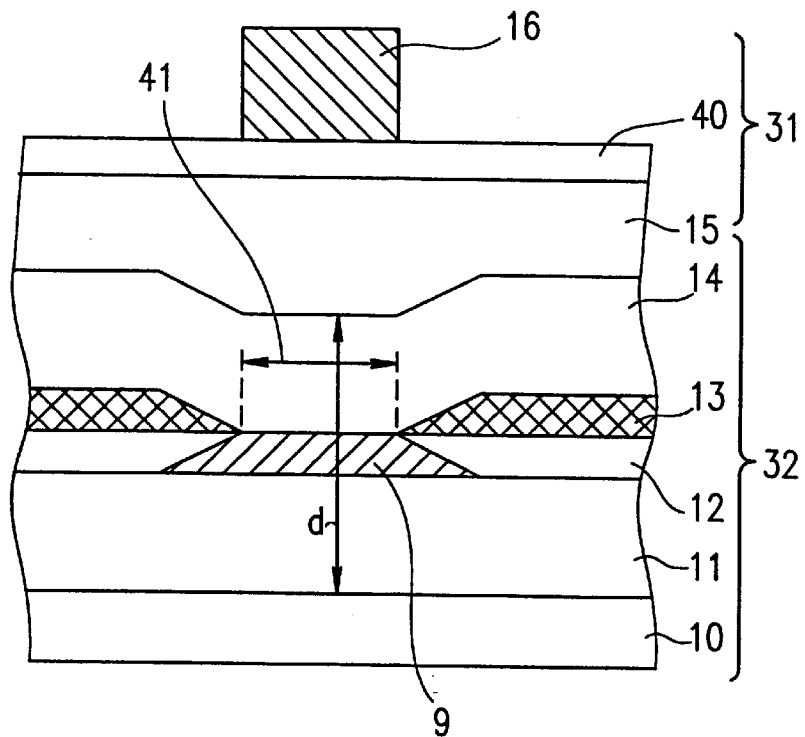
FIG. 7A is a cross-sectional view illustrating an MR head integrated with a recording head according to the present invention.

Since an MR head is a read only head, it is typically used in combination with an induction head for writing. FIGS. 6 and 7 illustrate a write head section 31 as well as a read head section 32. FIG. 7A illustrates the same structure as illustrated in FIG. 4 with the write head section 31 being additionally provided thereon. The write head section 31 includes an upper core 16 which is provided above the upper shield 15 via a recording gap film 40.

Figure 7B:
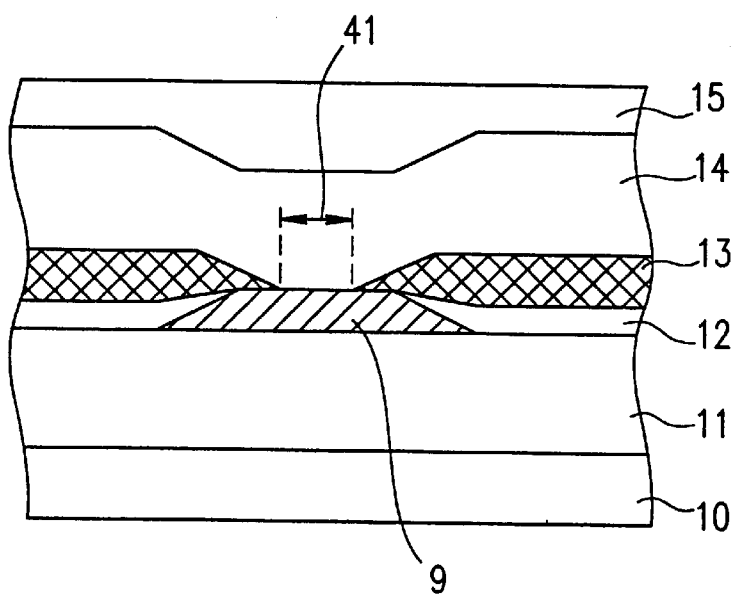
FIG. 7B is a cross-sectional view illustrating another MR head of the present invention.

While FIG. 7A illustrates an MR head having a conventional abutted junction, FIG. 7B illustrates another effective MR head with an overlaid structure in which a track width 41 can be more precisely controlled. Therefore, the structure illustrated in FIG. 7B may be able to better account for a track width reduction resulting from an increase in the recording density.

Now, the recording and reproduction mechanism of the MR head 30 will be described with reference to FIG. 6. Referring to FIG. 6, during a recording operation, a magnetic flux which is generated by an electric current and conducted through a coil 17 leaks through a space between the upper core 16 and the upper shield 15, thereby writing information on a magnetic disk 21. The MR head 30 moves in a direction indicated by an arrow c in the figure with respect to the magnetic disk 21, where it is possible to reverse a recording magnetization direction 23 by reversing the direction of the current flow though the coil 17. When the recording density is increased, the recording length (recording pitch) 22 becomes shorter, whereby it is necessary to reduce a recording gap length (recording gap pitch) 19 accordingly.

In a reproduction operation, a magnetic flux 24 leaking from a recording magnetization section of the magnetic disk 21 acts upon the MR device section 9 between the shields 10 and 15, thereby altering the resistance of the MR device section 9. Since a current is conducted to the MR device section 9 through the lead section 13, a change in the resistance thereof can be read as a change in the voltage (output) thereof.

Figure 8:
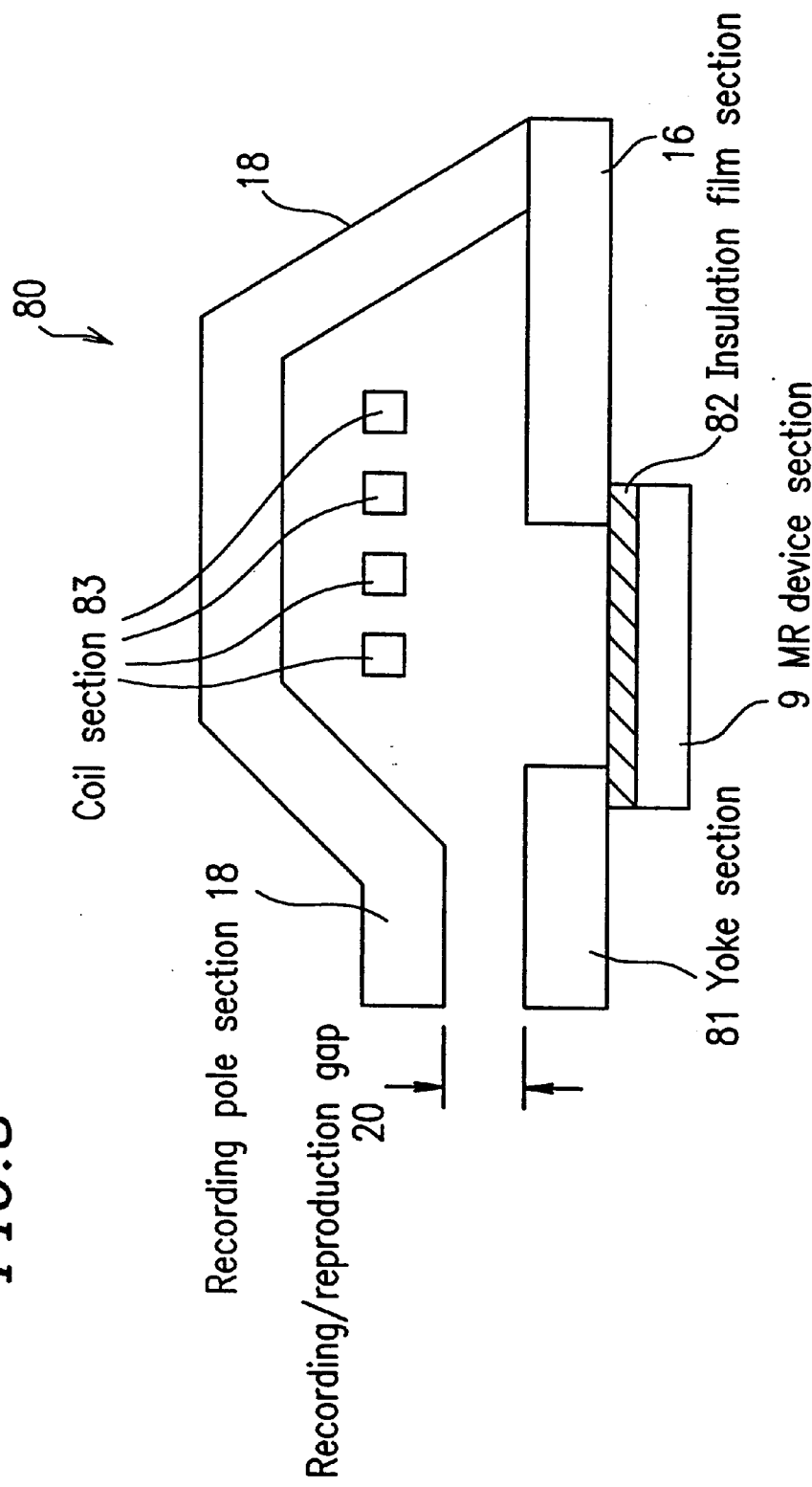
FIG. 8 is a cross-sectional view illustrating still another MR head of the present invention.

FIG. 8 illustrates a structure of a yoke-type head 80 incorporating the MR device of the present invention. The yoke-type head 80 includes the MR device section 9, a yoke section 81, an insulation film section 82, a recording pole section 18 and a coil section 83. The yoke section 81 and the recording pole section 18 together form a recording/reproduction gap 20.

Figure 9:
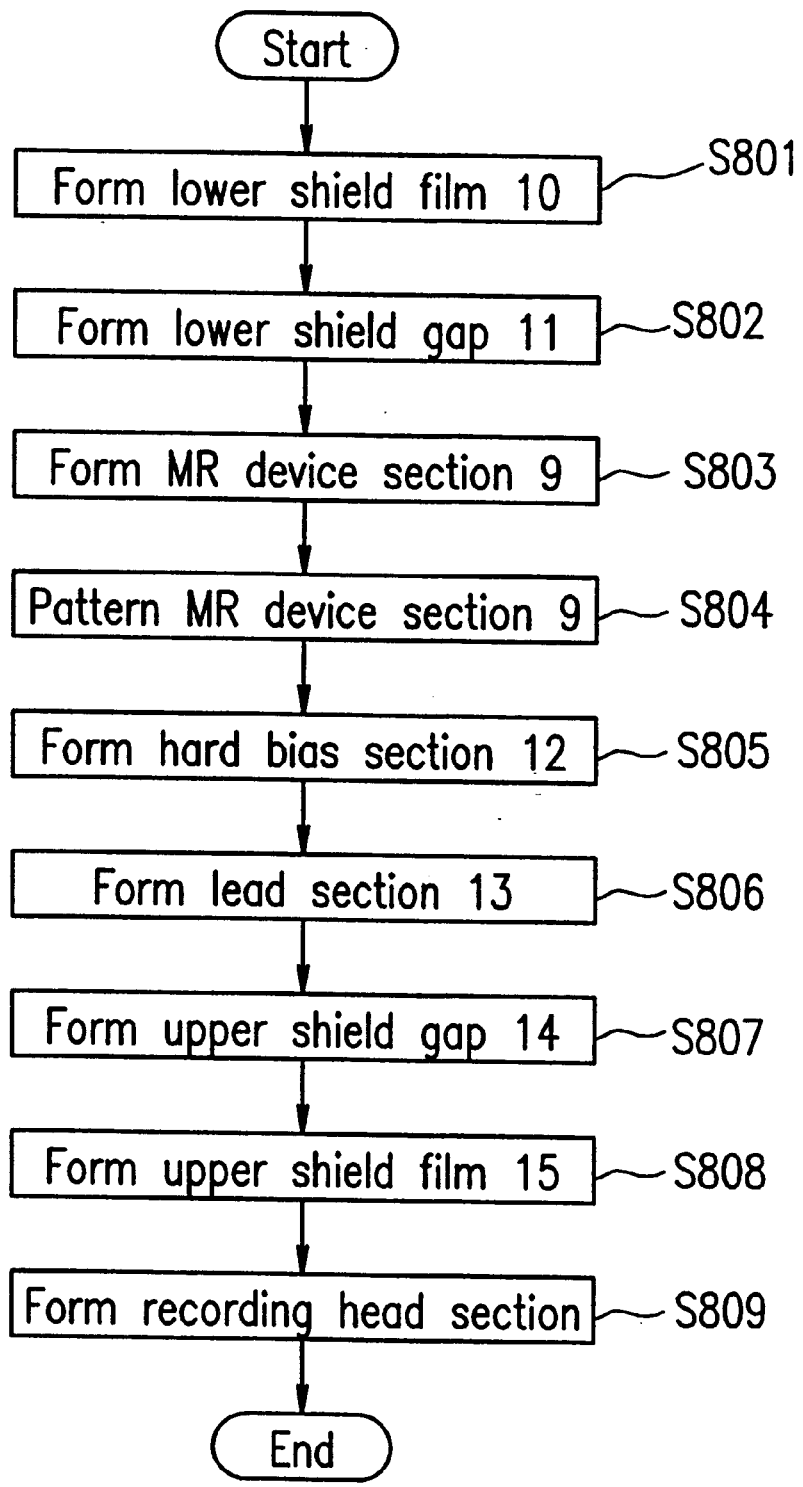
FIG. 9 is a flow chart illustrating steps of producing an MR head of the present invention.

Referring to FIG. 9, a method for producing the MR head 30 will now be described.

First, the lower shield 10, as illustrated in FIG. 4, is formed on an appropriately processed substrate (S801). Then, the lower gap shield 11 is formed on the lower shield 10 (S802), and an MR device section layer is formed on the lower shield gap 11 (S803). After the MR device section layer is patterned into the MR device section 9, as illustrated in FIG. 4 (S804), the hard bias section 12 (S805) and the lead section 13 (S806) are formed. Then, the upper shield gap 14 (S807) and the upper shield 15 (S808) are formed. Finally, the write head section 31 is formed, as illustrated in FIG. 7A (S809), thereby obtaining the MR head 30.

Figure 10:
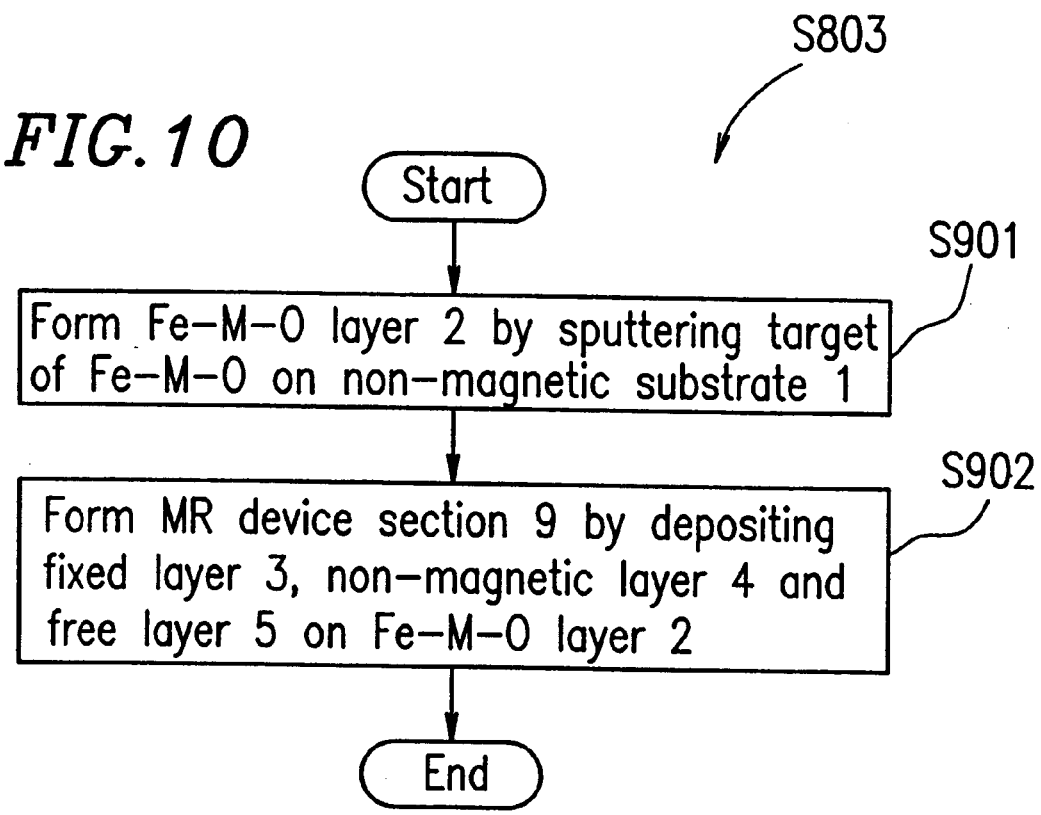
FIG. 10 is a flow chart illustrating steps of producing an MR device section of the present invention.

Referring to FIG. 10, the step of forming the MR device section 9 (S803) will be described in greater detail. The Fe—M—O layer 2 is formed by sputtering a target of Fe—M—O onto the non-magnetic substrate 1, as illustrated in FIG. 2 (S901). Then, the fixed layer 3, the non-magnetic film 4 and the free layer 5 are deposited in this order on the Fe—M—O layer 2, thereby obtaining the MR device section 9 (S902).

In order to obtain the MR device 300 as illustrated in FIG. 3, the non-magnetic layer 4, the fixed layer 3 and the magnetization rotation suppressing layer 6 are deposited in this order on the free layer 5, thereby obtaining the MR device section.

In view of a future increase in a recording density of a hard disk drive, the recording wavelength (recording pitch) should be shortened, for which it is necessary to shorten the distance d (indicated by reference numeral 18 in FIG. 6) between the shields as illustrated in FIG. 4. As can be seen from FIG. 4, it is necessary to reduce the thickness of the MR device section 9. Preferably, the thickness of the MR device section 9, excluding the antiferromagnetic film, should be about 20 nm or less. The antiferromagnetic Fe—M—O layer 2 used in the present invention is an insulator. Therefore, if the Fe—M—O layer 2 is provided as a part of the insulator (e.g., as a part of the gap shield 11 in FIG. 4), the thickness thereof is less restricted. When the Fe—M—O layer 2 is provided as a part of the MR device section 9, however, it should be as thin as possible. Preferably, the thickness of the Fe—M—O layer 2 should be about 40 nm or less, and more preferably about 20 nm or less.

In the MR device section 9, an axis of easy magnetization (also referred to as an "easy axis") of the free layer 5, as illustrated in FIGS. 2 and 3 is preferably arranged to be substantially perpendicular to the direction of a magnetic field of a signal to be detected, in order to suppress generation of Barkhausen noise during magnetization switching of the soft magnetic film.

The exchange coupling film, the MR device and the MR head of the present invention will now be described by way of illustrative examples.

EXAMPLE 1

An exchange coupling film according to Example 1 of the present invention was produced by using a multi-sputtering apparatus. $Fe_2O_3$ and $Co_{0.9}Fe_{0.1}$ were used as targets. A $Ti_2O_3$ chip was placed on the $Fe_2O_3$ target to produce an $(Fe_{1-x}Ti_x)_2O_3$ film.

After a vacuum chamber was exhausted to about $1 \times 10^{-8}$ Torr, an Ar gas was supplied therein so as to maintain the pressure therein at about 0.8 mTorr while the exchange coupling film 100, as illustrated in FIG. 1, was formed on the glass substrate using a sputtering method. Thus, a sample exchange coupling film A1 was produced. The respective thicknesses (in nm) of the layers of the sample film A1 are shown in parentheses. An RF cathode was used when $Fe_2O_3$ was employed, and a DC cathode was used when any other material was employed.

A1: $(Fe_{1-x}Ti_x)_2O_3(50)/Co_{0.9}Fe_{0.1}(10)$

The produced exchange coupling film was maintained in a vacuum at about 250° C. for about 1 hour while applying thereto a magnetic field of about 80 kA/m (1 kOe). Then, the magnetization curve of the exchange coupling film was measured at room temperature by using a vibrating sample magnetometer.

Figure 11:
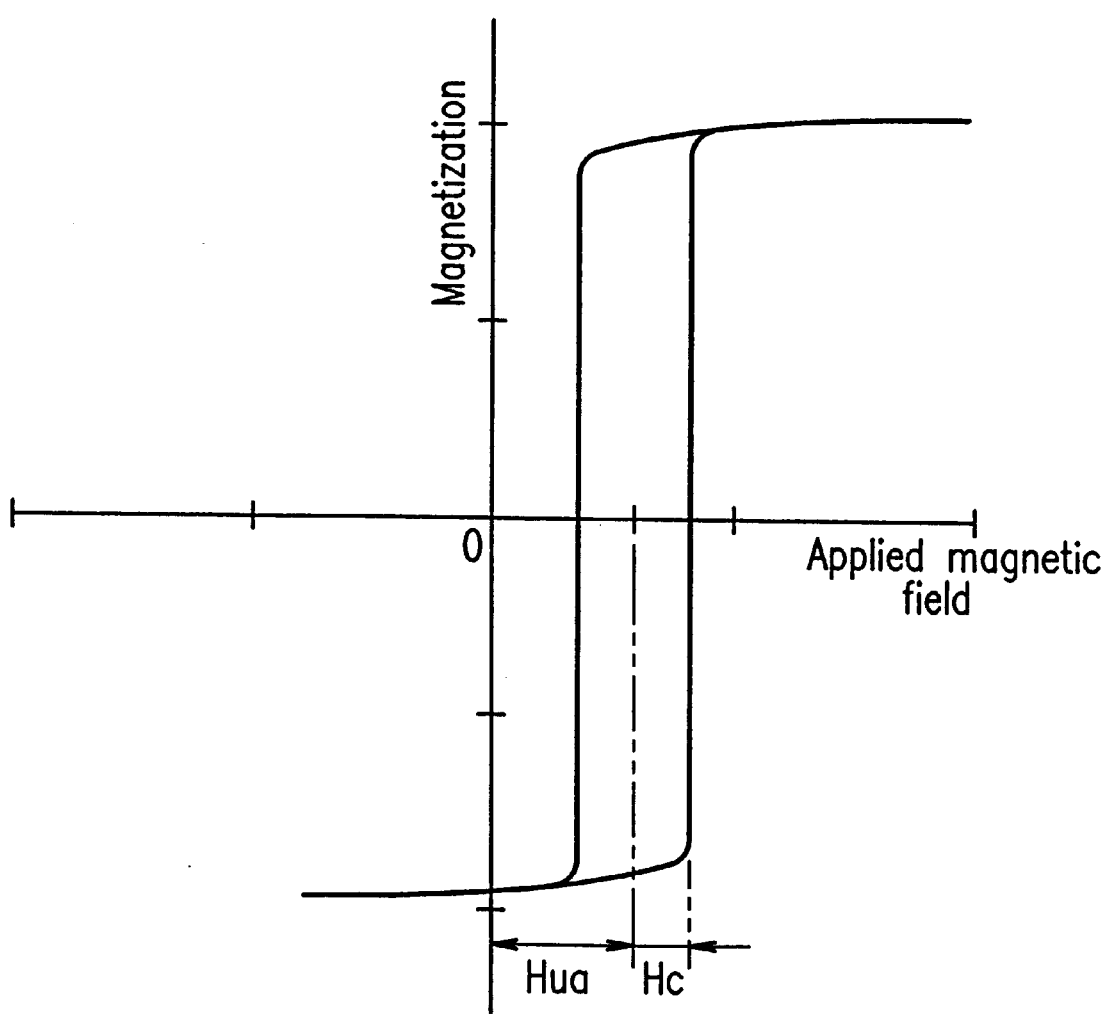
FIG. 11 is a graph illustrating a magnetization curve of the exchange coupling film of the present invention.

FIG. 11 is a graph schematically illustrating the measured magnetization curve. Since the $(Fe_{1-x}Ti_x)_2O_3$ magnetization rotation suppressing layer has scarcely any magnetization, the magnetization curve is virtually a magnetization curve of the $Co_{0.9}Fe_{0.1}$ layer of the exchange coupling film 100. In FIG. 11, the center of the magnetization curve is shifted from the origin of the graph by an amount Hua. The shift amount Hua represents the strength of the exchange bias. Another shift amount Hc is defined as being half the length between the two intersecting points between the magnetization curve and the horizontal axis representing the applied magnetic field. The shift amount Hc also tends to increase by the exchange bias magnetic field when an oxide magnetization rotation suppressing layer is employed.

Figure 12:
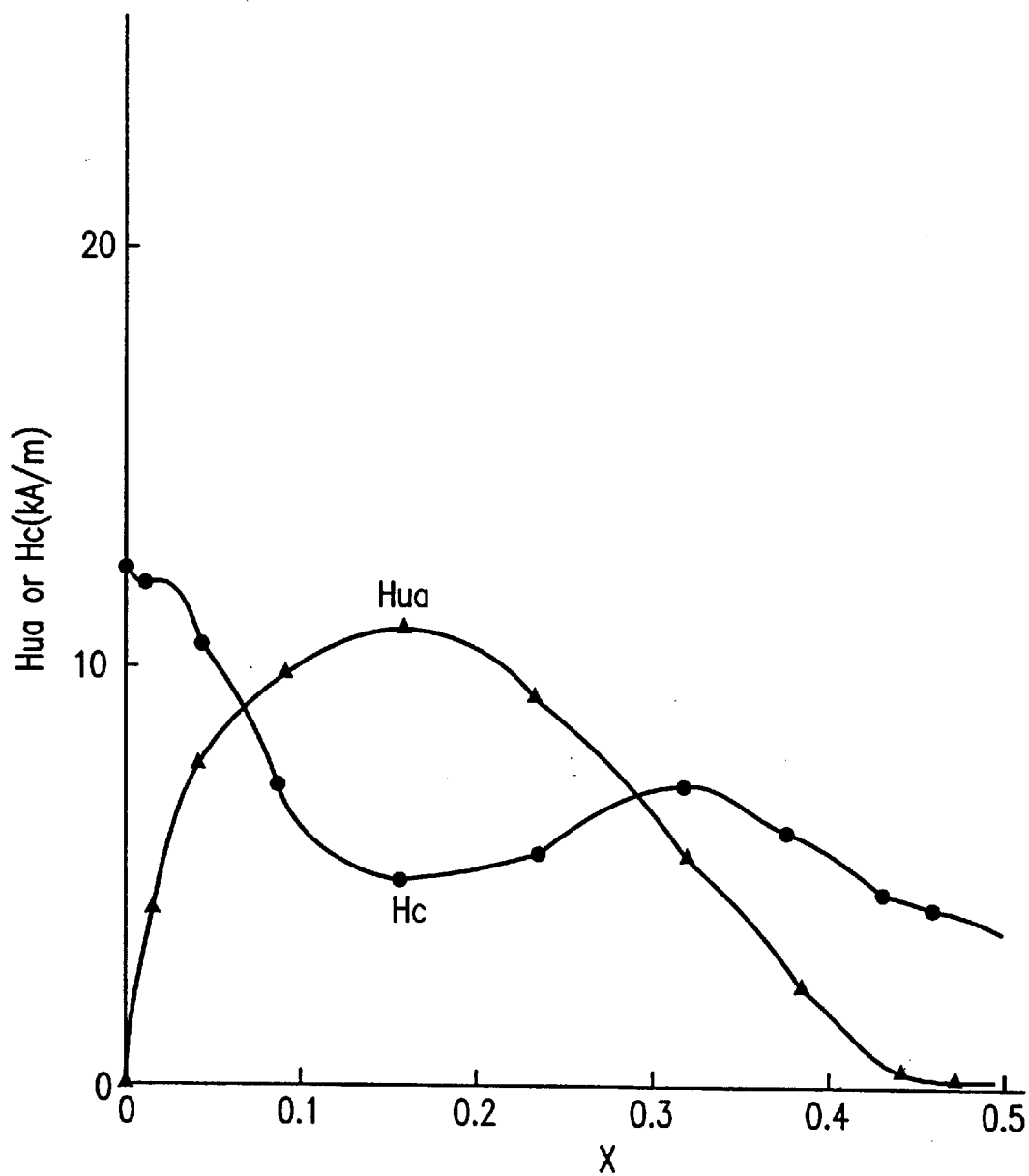
FIG. 12 is a graph illustrating an "x" dependency of Hc and Hua of an $(Fe_{1-x}Ti_x)_2O_3(50)/Co_{0.9}Fe_{0.1}(10)$ film.

FIG. 12 shows the shift amounts Hua and Hc of the exchange coupling film 100 for various values of x calculated from the magnetization curve of FIG. 11.

FIG. 12 shows that the shift amount Hua increases by introducing Ti. This means that if Ti is introduced, a unidirectional anisotropy is induced even by a heat treatment at a relatively low temperature. It is also shown that the shift amount Hua decreases when Ti is excessively introduced.

In the above-described example, the $Ti_2O_3$ chip is placed on the $Fe_2O_3$ target to produce an $(Fe_{1-x}Ti_x)_2O_3$ film. However, an alloy target can alternatively be used. Alternatively, a Ti chip can be placed on an $Fe_2O_3$ target. In such a case, however, special care must be taken so that the atomic composition ratio (Fe+Ti)/O is about 1/1.2 to about 1/1.6, e.g., by using an oxygen gas as a sputtering gas in addition to the Ar gas.

In FIG. 11, both of the shift amounts Hua and Hc rapidly drop in a composition range of x>0.4. This may be caused by magnetization occurring in the $(Fe_{1-x}Ti_x)_2O_3$ layer, which makes the $(Fe_{1-x}Ti_x)_2O_3$ layer ferromagnetic.

Magnetization may possibly occur also when the atomic composition ratio (Fe+Ti)/O is not about 1/1.2 to about 1/1.6, thereby reducing the shift amount Hua. When the $(Fe_{1-x}Ti_x)_2O_3$ film has magnetization, a magnetic flux may be generated therefrom, thereby adversely affecting the use of the exchange coupling film 100.

In the above-described example, Ti is added as a substituent element. Another sample film A2 was produced in substantially the same manner while partially substituting the Fe atoms in the $\alpha$-$Fe_2O_3$ film by another element such as Al, Co, Mn, Cr, Ni or V. A heat treatment was performed also in substantially the same manner as when employing Ti.

A2: $(Fe_{0.9}M_{0.1})_2O_3(50)/Co_{0.9}Fe_{0.1}(10)$

The shift amounts Hua and Hc of this sample exchange coupling film A2 were evaluated in substantially the same manner as the sample film A1. The results are shown in Table 1 below.

TABLE 1

| M (metal substituting Fe) | Hua (KA/m) | Hc (KA/m) |
|---|---|---|
| No substitution | 0.1 | 12.0 |
| Al | 10.2 | 5.5 |
| Co | 7.7 | 6.2 |
| Mn | 13.5 | 7.6 |
| Cr | 8.4 | 4.4 |
| Ni | 4.3 | 9.2 |
| V | 3.9 | 8.8 |

Table 1 shows that the shift amount Hua increases when partially substituting the Fe atoms in the $Fe_2O_3$ film by another element such as Al, Co, Mn, Cr, Ni or V.

As comparative examples, other exchange coupling films were produced in substantially the same manner as above while partially substituting the Fe atoms in the $Fe_2O_3$ film by another element such as Sn, Sb or Ge. The composition of each comparative example was adjusted so that the atomic composition ratio (Fe+M)/O is about 1/1.2 to about 1/1.6 (where M=Sn, Sb, Ge).

In the comparative examples, the shift amount Hua did not increase, while the shift amount Hc decreased, indicating that the effect of pinning the ferromagnetic fixed layer 3 is reduced.

EXAMPLE 2

A sample MR device B1, as illustrated in FIG. 2, was produced by using a multi-sputtering apparatus as in Example 1. An Si substrate was used as the substrate 1, an Fe—Al—O layer as the magnetization rotation suppressing layer 2, a Co layer as the ferromagnetic fixed layer 3, a Cu layer as the non-magnetic layer 4, and an $Ni_{0.68}Fe_{0.20}Co_{0.12}$ layer as the free layer 5. The atomic composition ratio of the employed Fe—Al—O layer was such that Al/(Fe+Al)= 0.05/1 and (Fe+Al)/O=about 1/1.2 to about 1/1.6. The respective thicknesses of the layers thereof were as shown below.

B1: Fe—Al—O(35)/Co(2)/Cu(2)/$Ni_{0.68}Fe_{0.20}Co_{0.12}$ (5)

As in Example 1, the sample MR device B1 produced as described above was subjected to a heat treatment at about 250° C. for about 30 minutes.

MR characteristics of the produced sample MR device B1 were evaluated while applying a magnetic field of up to about 40 kA/m by a DC 4-terminal method at room temperature. The results are shown in Table 2 below. For comparison, MR characteristics of another sample MR device B0 were also evaluated in substantially the same manner. The sample device B0 was produced by using an $Fe_2O_3$ layer in place of the Fe—Al—O layer.

TABLE 2

| Sample No. | Magnetization rotation regulating layer | MR ratio | Hp |
|---|---|---|---|
| B0 | $Fe_2O_3$ | 13.7 | 10 |
| B1 | Fe—Al—O | 12.9 | 21 |

Figure 13:
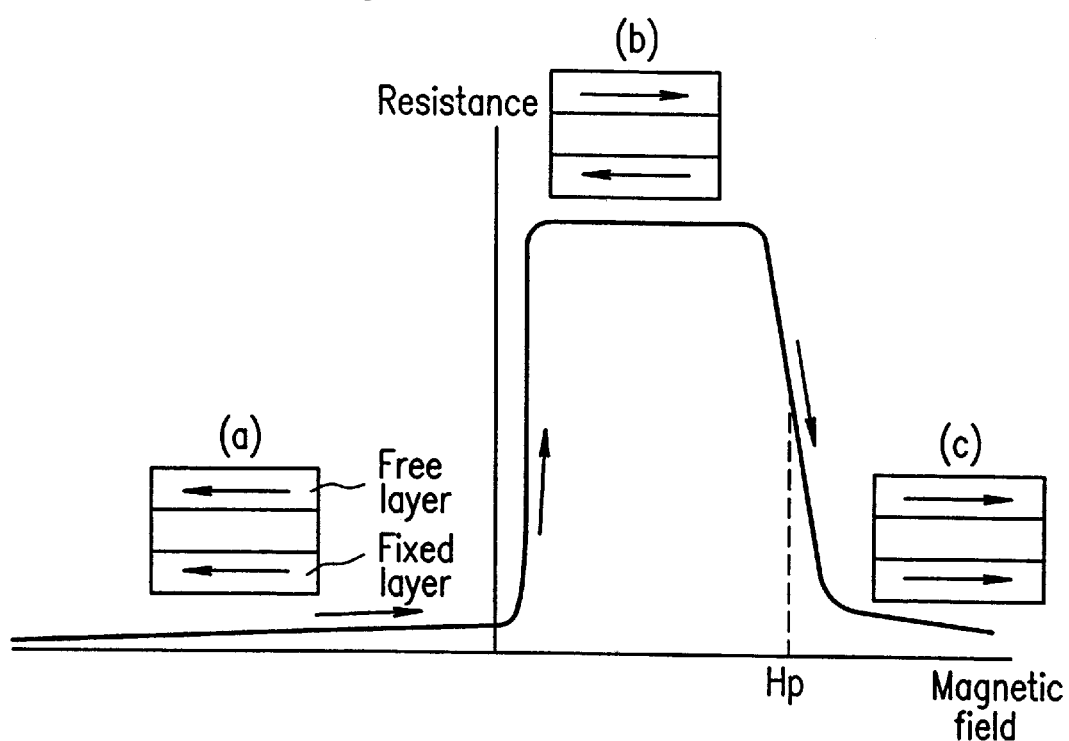
FIG. 13 is a graph illustrating an MR curve of an MR device of the present invention.

FIG. 13 generally shows the MR curve obtained for the sample device B1 shown in Table 2. Referring to FIG. 13, when a large negative magnetic field is applied to the MR device, the free layer 5 and the fixed layer 3 have substantially the same magnetization direction (at point (a)). As the magnetic field is increased gradually and over to the positive side, the magnetization direction of the free layer 5 is reversed, and then the resistance rapidly increases toward point (b). When the external magnetic field is further increased, the magnetization direction of the fixed layer 3 is also reversed, as shown at point (c), and the resistance is reduced to the original level. Referring to FIG. 13, "Hp" denotes a reverse magnetic field (also referred to as a "pinning magnetic field") which is defined as a magnitude of magnetic field being applied when the MR ratio becomes half of its peak after passing the peak (point (b)). Table 2 shows the respective Hp values measured for the sample devices.

Table 2 shows that the sample device B1 of the present invention has substantially the same MR ratio with a higher pinning magnetic field HP as compared with the comparative sample device B0.

Another sample device B2 was produced in substantially the same manner as the sample device B1 in which the free layer 5 includes a plurality of magnetic layers provided via the non-magnetic layer 4 interposed therebetween.

B2: Fe—Al—O(35)/Co(2)/Cu(2)/$Ni_{0.68}Fe_{0.20}Co_{0.12}$(2)/Cu(1)/$Ni_{0.68}Fe_{0.20}Co_{0.12}$(2)

The sample device B2 was evaluated in substantially the same manner as the sample device B1. The results showed that the sample device B2, as compared with the sample device B1, had substantially the same MR ratio and Hp, but had an improved soft magnetic property of the free layer 5, where the coercive force of the soft magnetic layer is reduced from about 800 A/m to about 400 A/m. Thus, by forming the free layer 5 with two or more magnetic layers provided via the non-magnetic layer 4 interposed therebetween, it is possible to improve the soft magnetic property of the free layer 5 and to improve the sensitivity of the MR device to the magnetic field.

A sample device B3 was produced in substantially the same manner as the sample device B1 while using Co(2)/Ru(0.6)/Co(2) having an antiferromagnetic exchange coupling as the fixed layer 3 in place of Co(2).

B3: Fe—Al—O(35)/Co(2)/Ru(0.6)/Co(2)/$Ni_{0.68}Fe_{0.20}Co_{0.12}$(5)

The sample device B3 was evaluated in substantially the same manner as the sample device B1. It was shown that the sample device B3, as compared with the sample device B1, had an MR ratio reduced by about 2.1%, but had Hp of about 40 kA/m or greater, while there was no influence on the free layer 5 by a bias due to a magnetic pole occurring at the end surface of the fixed layer 3.

Next, MR heads as illustrated in FIG. 5 were produced respectively using the sample devices B1 (the present invention), and B0 (comparative example), and the characteristics thereof were evaluated. In each of the produced MR heads, an $Al_2O_3$-TiC material was employed for the substrate, an $Ni_{0.8}Fe_{0.2}$ alloy for the shields 10 and 15, and $Al_2O_3$ for the shield gaps 11 and 14. Moreover, a Co—Pt alloy was used for the hard bias section 12, and Au for the lead section 13. The magnetic films were provided with an anisotropy in such a way that the easy axis of the fixed layer 3 was substantially parallel to the direction of a magnetic field of a signal to be detected, whereby the easy axis of the free layer 5 was substantially perpendicular to the direction of the magnetic field of the signal to be detected. This was achieved by first subjecting the produced MR device to a heat treatment at about 270° C. in a magnetic field so as to define the direction of the easy axis of the fixed layer 3, and then further subjecting the produced MR device to a heat treatment at about 180° C. so as to define the direction of the easy axis of the free layer 5.

The respective outputs of the produced MR heads were evaluated while conducting a DC current as a sense current through these MR heads and applying an alternating signal magnetic field of about 3 kA/m thereto. The output of the MR head employing the MR device B1 of the present invention was about the same as that of the MR head employing the comparative MR device B0. It should be noted, however, that when a DC magnetic field of about 15 kA/m was once applied to and then removed from the MR head during the measurement, the output of the MR head employing the comparative MR device B0 became unstable, while the output of the MR head employing the MR device B1 of the present invention was stable even after the application of the DC magnetic field.

EXAMPLE 3

Sample MR devices C1 to C10 having a structure as illustrated in FIG. 2 were produced in substantially the same manner as in Example 2, where Al/(Fe+Al)=0.1/1, Ti/(Fe+Ti)=0.1/1, Mn/(Fe+Co)=0.2/1, Cr/(Fe+Co)=0.2/1 and Cr/(Fe+Cr)=0.1/1. In this example, composite magnetization rotation suppressing layers were used as shown below. The Cu layer provided at the end of each sample device is an antioxidation film.

C1: Fe—Al—O(20)/$Co_{0.85}Fe_{0.15}$(1)/$Ni_{0.8}Fe_{0.2}$(5)/Cu(1)

C2: Fe—Co—O(20)/$Co_{0.85}Fe_{0.15}$(2)/Cu(2.2)/$Co_{0.85}Fe_{0.15}$(1)/$Ni_{0.8}Fe_{0.2}$/Cu(1)

C3: Fe—Cr—O(20)/$Co_{0.85}Fe_{0.15}$(2)/Cu(2.2)/$Co_{0.85}Fe_{0.15}$(1)/$Ni_{0.8}Fe_{0.2}$(5)/Cu(1)

C4: NiO(10)/Fe—Al—O(10)/$Co_{0.85}Fe_{0.15}$(2)/Cu(2.2)/$Co_{0.85}Fe_{0.15}$(1)/$Ni_{0.8}Fe_{0.2}$(5)/Cu(1)

C5: Fe—Ti—O(10)/Fe—Co—O(10)/Co$_{0.85}$Fe$_{0.15}$(2)/Cu(2.2)/Co$_{0.85}$Fe$_{0.15}$(1)/Ni$_{0.8}$Fe$_{0.2}$(5)/Cu(1)

C6: Fe—Mn—O(20)/Co$_{0.85}$Fe$_{0.15}$(2)/Cu(2.2)/Co$_{0.85}$Fe$_{0.15}$(1)/Ni$_{0.8}$Fe$_{0.2}$(5)/Cu(1)

C7: Fe—Ti—O(10)/Fe—Al—O(10)/Co$_{0.85}$Fe$_{0.15}$(2)/Cu(2.2)/Co$_{0.85}$Fe$_{0.15}$(1)/Ni$_{0.8}$Fe$_{0.2}$(5)/Cu(1)

C8: Fe$_2$O$_3$(20)/Co$_{0.85}$Fe$_{0.15}$(2)/Cu(2.2)/Co$_{0.85}$Fe$_{0.15}$(1)/Ni$_{0.8}$Fe$_{0.2}$/Cu(1)

C9: NiO/Co$_{0.85}$Fe$_{0.15}$(2)/Cu(2.2)/Co$_{0.85}$Fe$_{0.15}$(1)/Ni$_{0.8}$Fe$_{0.2}$/Cu(1)

C10: (Fe$_{0.9}$Al$_{0.1}$)$_2$O$_3$(10)/NiO(10)/Co$_{0.85}$Fe$_{0.15}$(2)/Cu(2.2)/Co$_{0.85}$Fe$_{0.15}$(1)/Ni$_{0.8}$Fe$_{0.2}$(5)/Cu(1)

The produced MR devices were subjected to a heat treatment at about 250° for about 30 minutes in substantially the same manner as in Example 1. The MR characteristics were evaluated in substantially the same manner as in Example 2. The results are shown in Table 3 below.

TABLE 3

| Sample No. | MR ratio | Hp |
|---|---|---|
| C1 | 13.7 | 12.2 |
| C2 | 16.2 | 38.5 |
| C3 | 13.8 | 15.5 |
| C4 | 12.9 | 23.5 |
| C5 | 16.0 | 36.0 |
| C6 | 17.0 | 22.5 |
| C7 | 15.1 | 25.3 |
| C8 | 6.3 | 7.6 |
| C9 | 3.8 | 5.4 |
| C10 | 13.3 | 17.7 |

Table 3 shows that the sample devices C1 to C7 and C10 of the present invention each have an exchange bias magnetic field Hp larger than those of the comparative sample devices C8 and C9, whereby it is easier to obtain magnetization antiparallelism and a larger MR ratio. An Fe—Mn—O layer and an Fe—Co—O layer are particularly effective in terms of the MR ratio. The sample devices C2 to C7 each have Hp larger than that of the sample device C1. An Fe—Co—O layer is particularly effective in terms of Hp.

The MR device of the present invention has been described above. It will be apparent from the above-described examples that the exchange coupling film of the present invention used in the MR device of the present invention would provide an exchange bias property superior to that of a conventional exchange coupling film.

EXAMPLE 4

Sample MR devices D1 to D11 (dual spin valve films) having a structure as illustrated in FIG. 3 were produced in substantially the same manner as in Example 1, where Al/(Fe+Al)=0.05/1, (Fe+Al)/O=2/3, Ti/(Fe+Ti)=0.05/1, (Fe+Ti)/O=2/3, Mn/(Fe+Mn)=0.02/1 and Co/(Fe+Co)=0.2/1.

D1: Fe$_2$O$_3$(30)/Co(3)/Cu(2.5)/Co(1)/Ni$_{0.8}$Fe$_{0.2}$/Co(1)/Cu(2.5)/Co(3)/Ir—Mn(8)

D2: Fe—Al—O(30)/Co(3)/Cu(2.5)/Co(1)/Ni$_{0.8}$Fe$_{0.2}$(5)/Co(1)/Cu(2.5)/Co(3)/Ir—Mn(8)

D3: Fe—Al—O(30)/Co(3)/Cu(2.5)/Co(1)/Ni$_{0.8}$Fe$_{0.2}$(5)/Co(1)/Cu(2.5)/Co(3)/Fe—Co—O(30)

D4: Fe—Mn—O(30)/Co(3)/Cu(2.5)/Co(1)/Ni$_{0.8}$Fe$_{0.2}$(5)/Co(1)/Cu(2.5)/Co(3)/Fe—Co—O(30)

D5: NiO(10)/Fe—Co—O(20)/Co(3)/Cu(2.5)/Co(1)/Ni$_{0.8}$Fe$_{0.2}$/Co(1)/Cu(2.5)/Co(3)/Fe—Co—O(30)

D6: Fe—Ti—O(30)/Co(3)/Cu(2.5)/Co(1)/Ni$_{0.8}$Fe$_{0.2}$/Co(1)/Cu(2.5)/Co(3)/Ir—Mn(8)

D7: Fe—Ti—O(30)/Co(3)/Cu(2.5)/Co(1)/Ni$_{0.8}$Fe$_{0.2}$(5)/Co(1)/Cu(2.5)/Co(3)/Fe—Ti—O(30)

D8: Fe—Ti—O(30)/Co(3)/Cu(2.5)/Co(1)/Ni$_{0.8}$Fe$_{0.2}$(5)/Co(1)/Cu(2.5)/Co(3)/Fe—Co—O(30)

D9: Fe—Ti—O(30)/Co(3)/Cu(2.5)/Co(1)/Ni$_{0.8}$Fe$_{0.2}$(5)/Co(1)/Cu(2.5)/Co(3)/NiO(30)

D11: Fe—Al—O(30)/Co(3)/Cu(2.5)/Co(1)/Ni$_{0.8}$Fe$_{0.2}$(5)/Co(1)/Cu(2.5)/Co(3)/PtMn(20)

The produced MR devices were subjected to a heat treatment in substantially the same manner as in Example 1. The MR characteristics were evaluated in substantially the same manner as in Example 2. The results are shown in Table 4 below.

TABLE 4

| Sample No. | MR ratio |
|---|---|
| D1 | 13.5 |
| D2 | 20.5 |
| D3 | 23.9 |
| D4 | 28.0 |
| D5 | 28.0 |
| D6 | 20.3 |
| D7 | 20.8 |
| D8 | 26.2 |
| D9 | 21.5 |
| D10 | 23.6 |
| D11 | 19.9 |

Table 4 shows that the sample MR devices D2 to D9 each have an MR ratio larger than that of the comparative MR device D1.

It is believed that such a result is due to the pinning effect of the layer magnetization rotation suppressing layer 6 of the Fe—M—O layer 2, as illustrated in FIG. 3, being sufficient to fix the magnetization direction of the fixed layer 3, thereby providing good magnetization antiparallelism between the fixed layer 3 and the free layer 5. Each of the sample devices D2, D6 and D11 has a slightly smaller MR ratio, but provides a greater pinning effect of the magnetization rotation suppressing layer 6 than those provided by the sample devices D3 to D5 and D7 to D9.

Another sample device D10 was produced in substantially the same manner as the sample device D3 where the free layer 5 includes three layers provided via the non-magnetic layer 4 interposed therebetween.

D10: Fe—Al—O(30)/Co(3)/Cu(2.5)/Co(1)/ Ni$_{0.8}$Fe$_{0.2}$(1.5)/Cu(0.6)/Ni$_{0.8}$Fe$_{0.2}$(1.5)/Cu(0.6)/ Ni$_{0.8}$Fe$_{0.2}$(1.5)/Co(1)/Cu(2.5)/Co(3)/Fe—Co—O(30)

The sample device D10 was evaluated in substantially the same manner as the sample device D3. The results showed that the sample device D10 of the present invention had an MR ratio and Hp that are substantially the same as those of the sample device D3, but the soft magnetic property of the free layer 5 was improved, and the coercive force of the soft magnetic layer was reduced from about 800 A/m to about 250 A/m. Thus, by forming the free layer 5 with two or more magnetic layers provided via the non-magnetic layer 4 interposed therebetween, it is possible to improve the soft magnetic property of the free layer 5 and to improve the sensitivity of the MR device to the magnetic field.

Another sample device D12 was produced in substantially the same manner as the sample device D11 while using Co(2)/Ru(0.7)/Co(3) having an antiferromagnetic exchange coupling as the fixed layer 3 in place of Co(3).

D12: Fe—Al—O(30)/Co(2)/Ru(0.7)/Co(3)/Cu(2.5)/Co(1)/Ni$_{0.8}$Fe$_{0.2}$(5)/Co(1)/Cu(2.5)/Co(3)/Ru(0.7)/Co(2)/Pt—Mn(20)

The sample device D12 was evaluated in substantially the same manner as the sample device D11. It was shown that the sample device D12 had an MR ratio reduced by about 3.5% from that of the sample device D11, but had an Hp about three times greater as that of the sample device D11,

EXAMPLE 5

Sample MR devices E were produced in substantially the same manner as in Example 2 on various glass substrates which have been subjected to a surface treatment using an ion beam under various conditions so that the glass substrates have various surface roughnesses.

E: 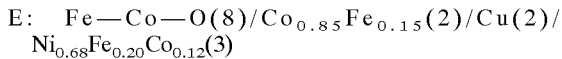
Fe—Co—O(8)/Co$_{0.85}$Fe$_{0.15}$(2)/Cu(2)/Ni$_{0.68}$Fe$_{0.20}$Co$_{0.12}$(3)

Table 5 below shows the surface roughnesses and the MR ratios of the produced sample devices E. The surface roughnesses were evaluated by using an STM (Scanning Tunneling Microscope). Ten 10 nm×10 nm areas were randomly selected across the 10 mm×10 mm surface of each sample device. The surface roughness of each area was determined as the difference in height between the highest point therein and the lowest point therein. The surface roughness values of the ten areas were averaged to obtain the surface roughness of that sample device.

TABLE 5

| Surface roughness (nm) | MR ratio (%) |
|---|---|
| 0.38 | 13.3 |
| 0.45 | 12.9 |
| 0.52 | 8.6 |
| 0.68 | 4.3 |
| 1.22 | 2.7 |

Table 5 shows that the sample devices with surface roughnesses of about 0.5 nm or less have larger MR ratios.

EXAMPLE 6

A yoke-type MR head 80, as illustrated in FIG. 8, was produced using the sample device D7 of Example 4.

An Al—O super thin film about 2 nm thick produced by a plasma oxidation method was used for the insulation film section 82 in the structure illustrated in FIG. 8. A Co—Nb—Zr-type amorphous alloy layer having a high transmissivity was used for the yoke section 81. A comparison was made between the output of the yoke-type MR head of this example and that of a comparative MR head which was produced in substantially the same manner while using the sample MR device D1 of Example 5. The comparison showed that the output of the yoke-type MR head of this example was increased by about +3 db from that of the comparative MR head.

As described above, an exchange coupling film employing the oxide magnetization rotation suppressing layer of the present invention applies a larger exchange bias magnetic field to a ferromagnetic body than that applied by a conventional exchange coupling film. As a result, the magnetization direction of the fixed layer is stable, thereby providing an exchange coupling film having a good thermal stability and a large MR ratio, an MR device incorporating such an exchange coupling film, and an MR head incorporating such an MR device.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. An exchange coupling film, comprising a substrate and a multilayer film, wherein:
    the multilayer film comprises a ferromagnetic layer and a magnetization rotation suppressing layer provided adjacent to the ferromagnetic layer for suppressing a magnetization rotation of the ferromagnetic layer; and
    the magnetization rotation suppressing layer comprises an Fe—M—O layer (where M=Al, Ti, Co, Mn, Cr, Ni or V).

2. An exchange coupling film according to claim 1, wherein the magnetization rotation suppressing layer comprises an (Fe$_{1-x}$M$_x$)$_2$O$_3$ layer (where M=Al, Ti, Co, Mn, Cr, Ni or V, and $0.01 \leq x \leq 0.4$).

3. An exchange coupling film according to claim 1, wherein the magnetization rotation suppressing layer is a multilayer comprising the Fe—M—O layer and an NiO layer formed on the Fe—M—O layer.

4. An exchange coupling film according to claim 1, wherein:
    the magnetization rotation suppressing layer is a multilayer comprising the Fe—M—O layer and an Fe—M'—O layer (where M'=Al, Ti, Co, Mn, Cr, Ni or V) formed on the Fe—M—O layer; and
    the Fe—M'—O layer has a composition different from that of the Fe—M—O layer.

5. An exchange coupling film according to claim 1, wherein a surface roughness of the multilayer film is about 0.5 nm or less.

6. An exchange coupling film according to claim 1, wherein a thickness of the magnetization rotation suppressing layer is in a range between about 5 nm and about 100 nm.

7. An exchange coupling film according to claim 6, wherein the thickness of the magnetization rotation suppressing layer is in a range between about 5 nm and about 50 nm.

8. An exchange coupling film according to claim 1, wherein the exchange coupling film is formed by a process including a step of subjecting the exchange coupling film, after the magnetization rotation suppressing layer and the ferromagnetic layer are formed, to a heat treatment in a magnetic field at a temperature of about 150° C. to about 350° C.

9. A magnetoresistance effect device, comprising a substrate and a multilayer film, wherein:
    the multilayer film comprises at least two ferromagnetic layers, a non-magnetic layer, and a magnetization rotation suppressing layer for suppressing a magnetization rotation of one of the ferromagnetic layers;
    the ferromagnetic layers are provided via the non-magnetic layer interposed therebetween;
    at least one of the ferromagnetic layers is a fixed layer whose magnetization direction is fixed by the magnetization rotation suppressing layer which is provided in contact with the one of the ferromagnetic layers on an opposite side of another one of the ferromagnetic layers with respect to the non-magnetic layer;
    at least one of the ferromagnetic layers is a free layer whose magnetization direction is allowed to rotate freely;
    a change in an angle between the magnetization direction of the fixed layer and the magnetization direction of the free layer causes an electric resistance of the device to vary; and the magnetization rotation suppressing layer comprises an Fe—M—O layer (where M=Al, Ti, Co, Mn, Cr, Ni or V).

10. A magnetoresistance effect device according to claim 9, wherein the magnetization rotation suppressing layer comprises an $(Fe_{1-x}M_x)_2O_3$ layer (where M=Al, Ti, Co, Mn, Cr, Ni or V, and $0.01 \leq x \leq 0.4$).

11. A magnetoresistance effect device according to claim 9, wherein the magnetization rotation suppressing layer is a multilayer comprising the Fe—M—O layer and an NiO layer formed on the Fe—M—O layer.

12. A magnetoresistance effect device according to claim 9, wherein the magnetization rotation suppressing layer is a multilayer comprising the Fe—M—O layer and an Fe—M'—O layer (where M'=Al, Ti, Co, Mn, Cr, Ni or V) formed on the Fe—M—O layer; and the Fe—M'—O layer has a composition different from that of the Fe—M—O layer.

13. A magnetoresistance effect device according to claim 9, wherein a surface roughness of the multilayer film is about 0.5 nm or less.

14. A magnetoresistance effect device according to claim 9, wherein a thickness of the magnetization rotation suppressing layer is in a range between about 5 nm and about 100 nm.

15. A magnetoresistance effect device according to claim 14, wherein the thickness of the magnetization rotation suppressing layer is in a range between about 5 nm and about 50 nm.

16. A magnetoresistance effect device according to claim 9, wherein the magnetoresistance effect device is formed by a process including a step of subjecting the magnetoresistance effect device, after the magnetization rotation suppressing layer and the fixed layer are formed, to a heat treatment in a magnetic field at a temperature of about 150° C. to about 350° C.

17. A magnetoresistance effect device according to claim 9, wherein:

the multilayer includes a first magnetization rotation suppressing layer, a first fixed layer, a first non-magnetic layer, a ferromagnetic free layer, a second non-magnetic layer, a second fixed layer and a second magnetization rotation suppressing layer which are deposited in this order on the substrate;

the first magnetization rotation suppressing layer comprises an Fe—M—O layer (where M=Al, Ti, Co, Mn, Cr, Ni or V);

the first magnetization rotation suppressing layer fixes a magnetization direction of the first fixed layer; and the second magnetization rotation suppressing layer fixes a magnetization direction of the second fixed layer.

18. A magnetoresistance effect device according to claim 17, wherein the first magnetization rotation suppressing layer comprises an $(Fe_{1-x}M_x)_2O_3$ layer (where M=Al, Ti, Co, Mn, Cr, Ni or V, and $0.01 \leq x \leq 0.4$).

19. A magnetoresistance effect device according to claim 17, wherein the second magnetization rotation suppressing layer comprises an NiO layer or an Fe—M—O layer (where M=Al, Ti, Co, Mn, Cr, Ni or V).

20. A magnetoresistance effect device according to claim 9, wherein the free layer comprises a third non-magnetic layer and two or more magnetic layers provided with the third non-magnetic layer interposed therebetween.

21. A magnetoresistance effect device according to claim 17, wherein the free layer comprises a third non-magnetic layer and two or more magnetic layers provided with the third non-magnetic layer interposed therebetween.

22. A magnetoresistance effect device according to claim 9, wherein the fixed layer comprises a third non-magnetic layer and two magnetic layers having an antiferromagnetic exchange coupling therebetween with the third non-magnetic layer interposed therebetween.

23. A magnetoresistance effect device according to claim 17, wherein at least one of the fixed layers comprises a third non-magnetic layer and two magnetic layers having an antiferromagnetic exchange coupling therebetween with the third non-magnetic layer interposed therebetween.

24. A magnetoresistance effect head, comprising:

a magnetoresistance effect device according to claim 9; and a shield gap section for insulating the magnetoresistance effect device from a shield section.

25. A magnetoresistance effect head, comprising:

a magnetoresistance effect device according to claim 9; and a yoke section for introducing into the magnetoresistance effect device a magnetic field to be detected.

26. A method for producing a magnetoresistance effect device, the device comprising a substrate and a multilayer film, wherein:

the multilayer film comprises at least two ferromagnetic layers, a non-magnetic layer, and a magnetization rotation suppressing layer for suppressing a magnetization rotation of the one of ferromagnetic layers;

the ferromagnetic layers are provided with the non-magnetic layer interposed therebetween;

at least one of the ferromagnetic layers is a fixed layer whose magnetization direction is fixed by the magnetization rotation suppressing layer which is provided in contact with the one of the ferromagnetic layers on an opposite side of another one of the ferromagnetic layers with respect to the non-magnetic layer;

at least one of the ferromagnetic layers is a free layer whose magnetization direction is allowed to rotate freely; and a change in an angle between the magnetization direction of the fixed layer and the magnetization direction of the free layer causes an electric resistance of the device to vary, the method comprising:

a first step of forming the magnetization rotation suppressing layer on the substrate; and a second step of depositing the fixed layer, the non-magnetic layer and the free layer in this order on the magnetization rotation suppressing layer, wherein the first step comprises a step of sputtering a target whose main component is Fe—M—O (where M=Al, Ti, Co, Mn, Cr, Ni or V).

27. A method for producing a magnetoresistance effect device, the device comprising a substrate and a multilayer film, wherein:

the multilayer film comprises a first magnetization rotation suppressing layer, a first fixed layer, a first non-magnetic layer, a ferromagnetic free layer, a second non-magnetic layer, a second fixed layer and a second magnetization rotation suppressing layer which are deposited in this order on the substrate;

the first magnetization rotation suppressing layer fixes a magnetization direction of the first fixed layer; and the second magnetization rotation suppressing layer fixes a magnetization direction of the second fixed layer; and a change in an angle between the magnetization directions of the first and second fixed layers and the magnetization direction of the free layer causes an electric resistance of the device to vary, the method comprising:

a first step of forming the first magnetization rotation suppressing layer on the substrate;

a second step of depositing the first fixed layer, the first non-magnetic layer, the free layer, the second non-magnetic layer and the second fixed layer in this order on the first magnetization rotation suppressing layer; and a third step of forming the second magnetization rotation suppressing layer on the second fixed layer, wherein the first and third steps each comprise a step of sputtering a target whose main component is Fe—M—O (where M=Al, Ti, Co, Mn, Cr, Ni or V).

* * * * *